US009985647B2

(12) United States Patent
Lee et al.

(10) Patent No.: US 9,985,647 B2
(45) Date of Patent: May 29, 2018

(54) ENCODER AND DECODER DESIGN FOR NEAR-BALANCED CODES

(71) Applicant: SK hynix Inc., Gyeonggi-do OT (KR)

(72) Inventors: Frederick K. H. Lee, Mountain View, CA (US); Marcus Marrow, San Jose, CA (US)

(73) Assignee: SK Hynix Inc., Gyeonggi-do (KR)

(*) Notice: Subject to any disclaimer, the term of this patent is extended or adjusted under 35 U.S.C. 154(b) by 147 days.

(21) Appl. No.: 15/061,650

(22) Filed: Mar. 4, 2016

(65) Prior Publication Data
US 2016/0259595 A1 Sep. 8, 2016

Related U.S. Application Data

(60) Provisional application No. 62/128,288, filed on Mar. 4, 2015.

(51) Int. Cl.
| H03M 7/00 | (2006.01) |
| H03M 7/14 | (2006.01) |
| H03M 13/11 | (2006.01) |
| H03M 13/15 | (2006.01) |
| H03M 13/23 | (2006.01) |
| H03M 13/29 | (2006.01) |

(52) U.S. Cl.
CPC .......... *H03M 7/14* (2013.01); *H03M 13/1102* (2013.01); *H03M 13/152* (2013.01); *H03M 13/1515* (2013.01); *H03M 13/23* (2013.01); *H03M 13/2957* (2013.01); *H03M 13/2963* (2013.01)

(58) Field of Classification Search
CPC ............... H03M 7/14; H03M 13/2963; H03M 13/2957; H03M 13/23; H03M 13/1515; H03M 13/1102; H03M 13/152; H03M 7/00; H03M 5/00

USPC .............................. 341/50, 51, 106; 714/755
See application file for complete search history.

(56) References Cited

U.S. PATENT DOCUMENTS

| 7,148,821 B2* | 12/2006 | Thirumoorthy ......... H03M 7/40 341/106 |
| 7,493,548 B2* | 2/2009 | Nimbalker .......... H03M 13/033 714/755 |
| 9,048,855 B2 | 6/2015 | Bae et al. |
| 2006/0176195 A1* | 8/2006 | Thirumoorthy ......... H03M 7/40 341/51 |

OTHER PUBLICATIONS

Weber et al., Perspectives on Balanced Sequences, pre-print, Jan. 28, 2013, p. 1-12.
D. E. Knuth, Efficient balanced codes, Trans. Inf. Theory, Jan. 1986., pp. 51-53, vol. 32, No. 1, IEEE.
Fair et al., Guided scrambling: a new line coding technique for high bit rate fiber optic transmission systems, Trans. Commun., Feb. 1991., pp. 289-297, vol. 39, No. 2, IEEE.

* cited by examiner

*Primary Examiner* — Jean B Jeanglaude
(74) *Attorney, Agent, or Firm* — IP & T Group LLP

(57) ABSTRACT

Methods of encoding a near-symbol balanced (NSB) sequence may include selecting, with a controller, a constraint based on an amount of bits, determining, with the controller, a plurality of sections in a codebook based on permutations defined by the selected constraint, and partitioning, with the controller, a section among the plurality of sections into a plurality of partitions until each of the plurality of partitions include a number of entries equal to or less than a predetermined number of entries.

14 Claims, 27 Drawing Sheets

ENCODER AND DECODER DESIGN FOR NEAR-BALANCED CODES

CROSS-REFERENCE TO RELATED APPLICATIONS

This application claims the benefit of U.S. Provisional Application No. 62/128,288 filed Mar. 4, 2015 entitled "ENCODER AND DECODER DESIGN FOR NEAR-BALANCED CODES", the entire contents of which are incorporated herein by reference.

BACKGROUND

1. Field

Exemplary embodiments of the present disclosure relate to a signal processing and coding technique.

2. Description of the Related Art

Magnetic storage technology was most commonly used for storing data, but the lower weight and faster read/write operations requirements for current electronic devices make the magnetic storage technology less desirable.

SUMMARY

Aspects of the invention include methods of encoding a near-symbol balanced (NSB) sequence. The methods may include selecting, with a controller, a constraint based on an amount of bits, determining, with the controller, a plurality of sections in a codebook based on permutations defined by the selected constraint, and partitioning, with the controller, a section among the plurality of sections into a plurality of partitions until each of the plurality of partitions include a number of entries equal to or less than a predetermined number of entries.

Further aspects of the invention include systems for encoding an NSB sequence. The systems may include a controller suitable for selecting a constraint based on an amount of bits, determining a plurality of sections in a codebook based on permutations defined by the selected constraint, and partitioning a section among the plurality of sections into a plurality of partitions until each of the plurality of partitions include a number of entries equal to or less than a predetermined number of entries.

DETAILED DESCRIPTION

Figure 1A:
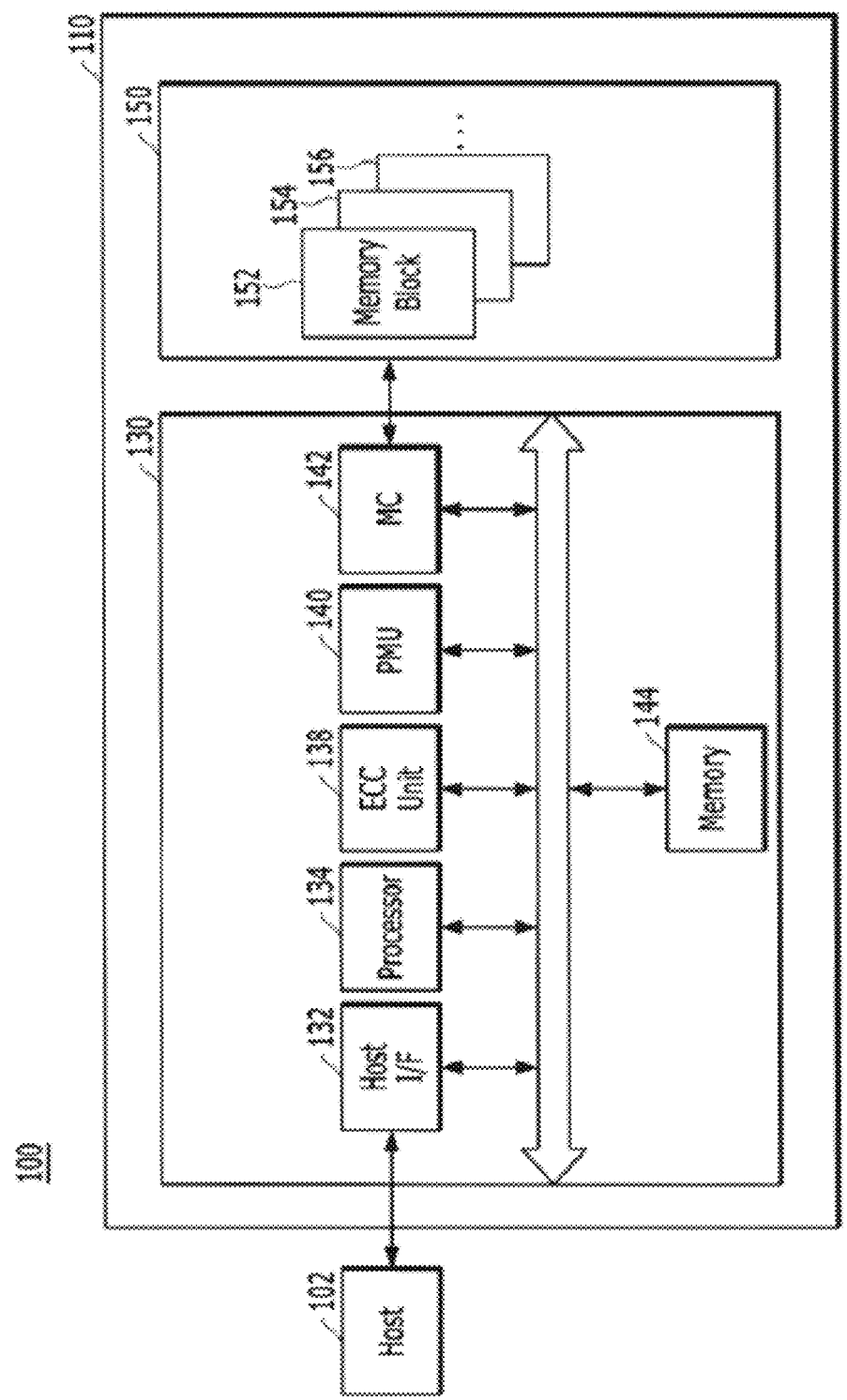
FIG. 1A illustrates a data processing system including a memory system in which embodiments of the present invention are applied.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

In some embodiments, the present invention will be applied to a data processing system shown in FIG. 1A.

FIG. 1A illustrates a data processing system 100 including a memory system in which embodiments of the present invention are applied. The data processing system 100 shown in FIG. 1A is for illustration only. Other constructions of the data processing system 100 could be used without departing from the scope of this disclosure. Although FIG. 1A illustrates one example of the data processing system 100 various changes may be made to FIG. 1A. For example, the data processing system 100 may include any of elements, or may not include any of elements in any suitable arrangement.

Referring to FIG. 1A, the data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102, and in particular, store data to be accessed by the host 102. In other words, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CE) card, a smart media (SM) card, a memory stick, and so forth.

The storage devices for the memory system 110 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PCRAM), a magnetoresistive RAM (MRAM) and a resistive RAM (RRAM).

The memory system 110 may include a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated in to one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card, The controller 130 and the memory device 150 may be integrated into one semiconductor device and configure a memory card such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, and a universal flash storage (UFS) device.

For another instance, the memory system 110 may configure a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a non-volatile memory device, for example, a flash memory. The flash memory may have a three-dimensional (3D) stack structure.

The controller 130 of the memory system 110 may control the memory device 150 in response to a request from the host 102. The controller 130 may provide the data read from the memory device 150, to the host 102, and store the data provided from the host 102 into the memory device 150. To this end, the controller 130 may control overall operations of the memory device 150, such as read, write, program and erase operations.

In detail, the controller 130 may include a host >interface unit 132, a processor 134, an error correction code (ECC) unit 138, a power management unit (PMU) 140 a memory controller (MC) 142, and a memory 144.

The host interface unit 132 may process commands and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA) parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The MC 142 may serve as a memory interface between the controller 130 and the memory device 150 to allow the controller 130 to control the memory device 150 in response to a request from the host 102. The MC 142 may generate control signals for the memory device 150 and process data under the control of the processor 134. When the memory device 150 is a flash memory such as a NAND flash memory, the MC 142 may generate control signals for the NAND flash memory 150 and process data under the control of the processor 134.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 110, and thus reliable bad block management is required.

Figure 1B:
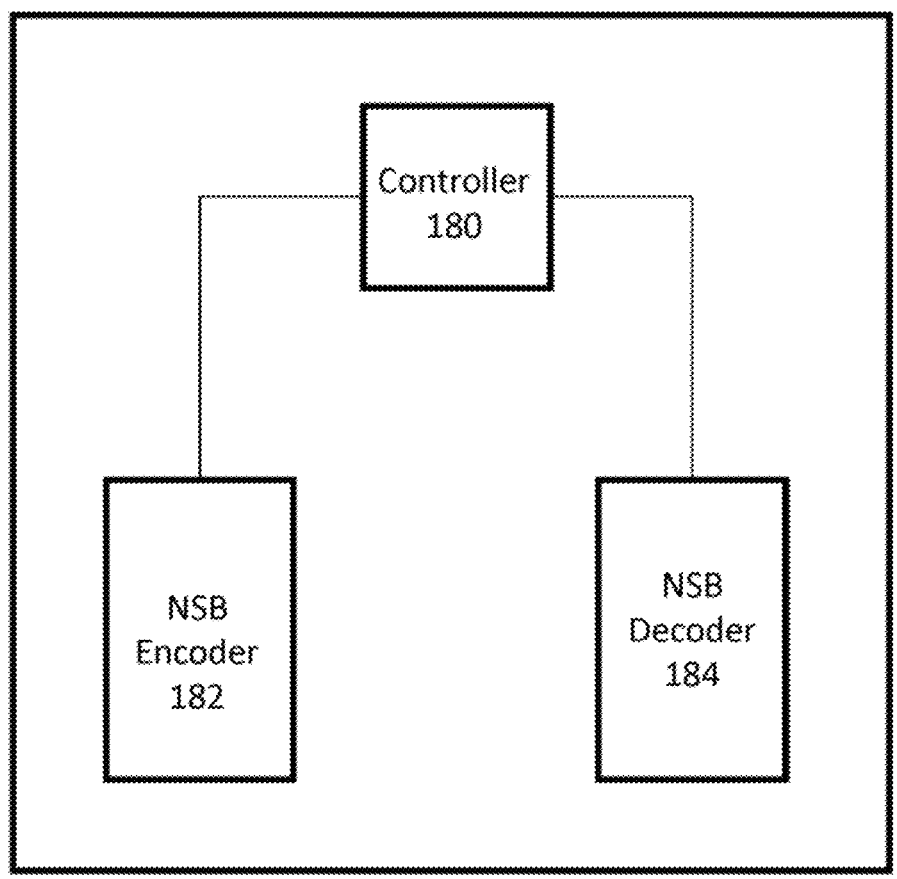
FIG. 1B is a block diagram of a memory system including an encoder and a decoder in accordance with embodiments of the present invention.

FIG. 1B shows a system according to aspects of the invention. The system includes a controller 180 (e.g., controller 130), a near symbol balance (NSB) encoder 182, and an NSB decoder 184. The NSB encoder 182 may be configured to encode NSB data, and the NSB decoder 184 may be configured to decode NSB data. The encoder 182 and decoder 184 may include hardware circuits needed to carry out the functions disclosed below, such as comparators, adder and subtraction circuits, multiplier and division circuits, circuits for mapping cells selected from a codebook to the original cells, etc., as will be understood by one of skill in the art from the description herein. The NSB encoder and decoder may be implemented on an MLC, TLC, QLC, SLC, etc.

A symbol-balanced sequence is where a sequence of length n is symbol balanced over an alphabet set A if each alphabet appears the same number of times in a sequence. For example, if n=12, and A={0, 1, 2, 3}, then [0,2,0,2,0, 2,1,3,1,3,1 3], or [0,0,0,1,1,1,2,2,2,3,3,3]. The number of symbol balanced sequences of length n are determined by $M=n!/((n/q)!)^q$, q being the number of alphabets in an alphabet set. For n=12 and q=4 as in the example above, M=369600.

In PCRAM, symbol balanced sequences may be advantageously written so that read thresholds can be determined easily. For cells from the same die, resistance likely drifts in the same direction together. If the written sequence is balanced, the lowest n/q sample values will likely correspond to data from the lower level, the next lowest n/q sample values will likely correspond to the $2^{nd}$ lower lever, etc. Read thresholds can be set appropriately using this information.

In previous implementations, there are various criteria on balancing a sequence. Most of which are focused on how to exactly balance a sequence under a specific criterion. Generally, the number of overhead bits needed to exactly balance a sequence with these methods gets closer to the theoretical minimum as the sequence length increases. Moreover, all these methods are applicable to multi-level sequences (e.g. non-binary).

In general, the encoding/decoding method is applicable to a wide variety of constraints, as long as all the sequences under the given constraint can be enumerated using combinatorial methods. Near symbol balancing is only one such constraint. However, there are many more possibilities. For example, exact symbol balancing is a constraint where every symbol in the alphabet set must appear the same number of times. Exact polarity balancing where, if the alphabet set is {−3, −1, +1, +3}, the number of positive and negative symbols must equal (assuming the sequence length is an even number). Exact charge balancing, where for the same alphabet set, the sum of the symbols in the sequence must equal 0. Near symbol and near charge balancing constraints can also be defined. In addition totally arbitrary constraints may be used that say, for example, the 1st symbol in the alphabet set must appear at least x number of times, the 2nd symbol in the alphabet set must appear no more than y number of times, and so on.

Although the examples described herein are for near-symbol balanced sequences, the encoding/decoding framework can be used for any constraint, as long as the sequences under the given constraint can be enumerated using combinatorics. Code rates may be different (e.g., different from 57/58), a minimum number of entries may be different (e.g., other than 256 entries, such as 128 or 64) etc.

To "near-balance" a sequence given a constraint, the typical method is guided scrambling. Note that exact balancing is merely a subset of near-balancing, as a near-balancing method can always be used to exactly balance a sequence by choosing the constraint of the output sequence to be exactly balanced. Guided scrambling is a probabilistic method, which means that the output sequence only satisfies the given constraint with a certain probability, but never guarantees that the output sequence always satisfies the given constraint.

The systems and methods disclosed herein are part of the near-balancing category. It is a practical implementation of enumerative coding, where all the sequences under a given constraint are exhaustively enumerated and a one-to-one mapping scheme is devised between all the possible input sequences and all the constrained sequences. The invention disclosed herein is advantageous for the following reasons.

Contrary to guided scrambling, this invention is a deterministic method, which means the output sequence is guaranteed to satisfy the given constraint.

The methods disclosed herein are capacity achieving for any sequence length, which means that the number of overhead bits required to near-balance a sequence given any constraint is identical to the theoretical minimum needed (the theoretical minimum is a function of the constraint).

This method may be used on any balancing criterion. For illustration, the invention is described herein with symbol-balancing, which is the criterion for phase change memory applications. However, the method is equally applicable to other balancing criteria.

This method may be used for multi-level sequences of any length. Due to implementation complexity, it may be best suited for short sequence length and a small number of levels. In some embodiments, this method is implemented for MLC and TLC phase change memory applications, where the number of levels is only 4 and 8, respectively, and there the sequence length is typically in the tens.

Since this method achieves capacity or any sequence length, when used to exactly balance a sequence, it requires fewer overhead bits than any currently known method which can only get close to capacity for infinitely long sequences. In other words, although this method is only practical for short sequences, this is exactly the scenario where it has the biggest advantage over the currently available methods.

The systems, processes and methods disclosed herein are described with respect to several examples. These examples are exemplary and not exclusive. Those of skill in the art will understand from the disclosure herein that alternative codebooks, different numbers of levels and sections, other dies and other number of dies, alternative constraint values, etc., may be utilized to effectuate the invention.

Figure 2:
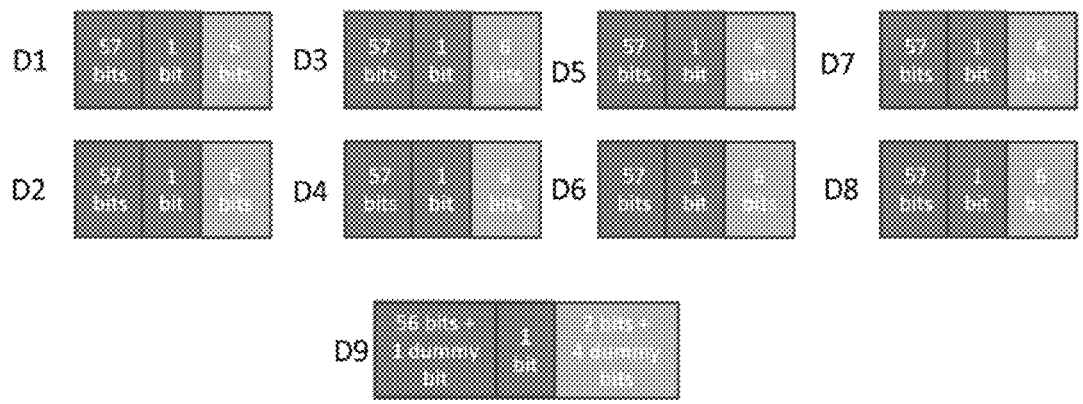
FIG. 2 is a diagram showing die layout according to aspects of the invention.
Figure 3:
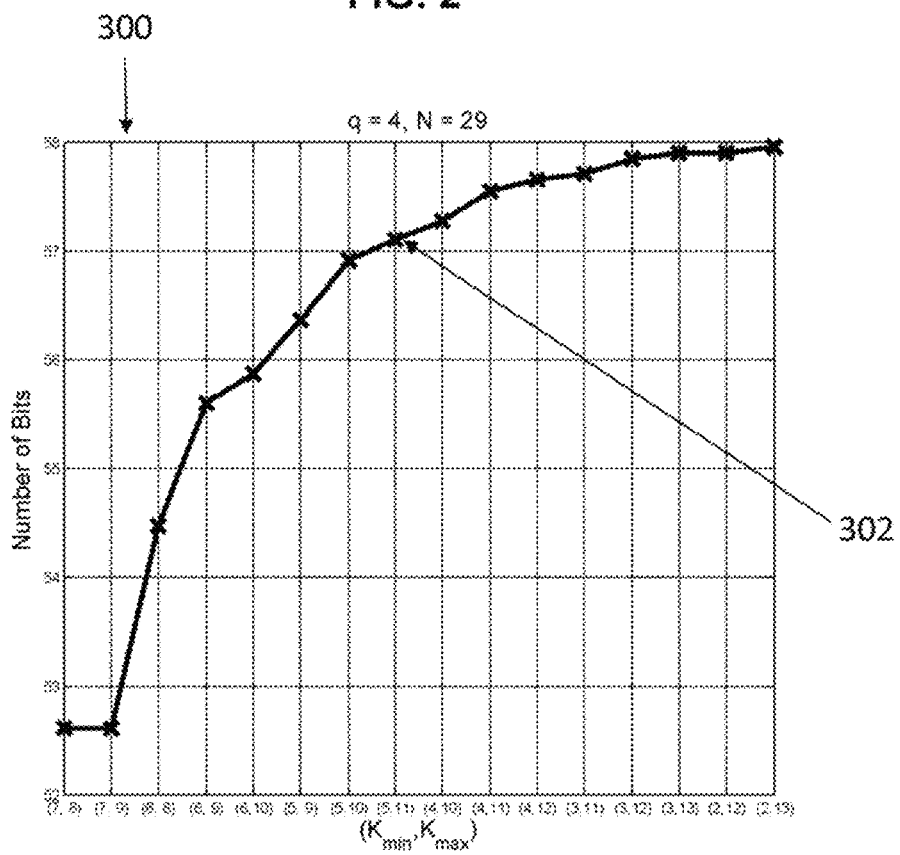
FIG. 3 is a graph showing selection of constraints in accordance with aspects of the invention.

Referring to FIGS. 2 and 3, constraint selection for a near symbol balanced (NSB) is described. In an alphabet set A, if each alphabet appears no fewer than Kmin times and no more than Kmax times in a sequence, the sequence is an NSB sequence with the constraint [Kmin, Kmax]

NSB sequences may be needed when there are not enough symbol-balanced sequences. For example, if n=12 and q=4, then M=369600, which is approximately 2^18.5. Therefore, Mtotal is 4^12, or 2^24, meaning that 24 bits are required to write 18 bits of information such that the rate is 0.75. For PCRAM applications, only 1 or 2 overhead bits are available. Therefore, it is necessary to relax the balancing constraint to increase the number of "valid" sequences. However, performance of detection algorithms will suffer, as read thresholds cannot be set as accurately.

Referring to FIG. 2, a unit has 9 dies (D1-D9). A single write unit is 64 bits per die, totaling 576 bits. For user data, the total number of bits is 64 bits×8, or 512 bits. Thus the number of bits per die is 56.89 For BCH parity (t=5), the total number of bits is 50 bits, thus 5.56 bits per die. The overhead for NSB code is 9 bits, or 1 bit per die. As shown in FIG. 2, dies D1-D8 include sections for 57 bits for user data, 6 bits for parity, and 1 bit for overhead. The die D9 includes amounts of dummy bits as is known in the art. BCH parity may be evenly distributed across all the dies to minimize degradation in any one die.

The NSB code rate, therefore, is 57/58. Thus the code constraint before including parity bits is [5,11], and the worst case constraint after including parity bits is [5,14]. In FIG. 3, a graph 300 is shown of the number of bits versus the constraint for an example where q=4 and N=29. Here, the constraint of [5,11] is selected, as its point 302 indicates the tightest NSB code constraint that gives at least 2^57 sequences. In other words, the number of bits per die is rounded to 57, thus, 57-bit numbers may be used as the data.

Figure 4A:
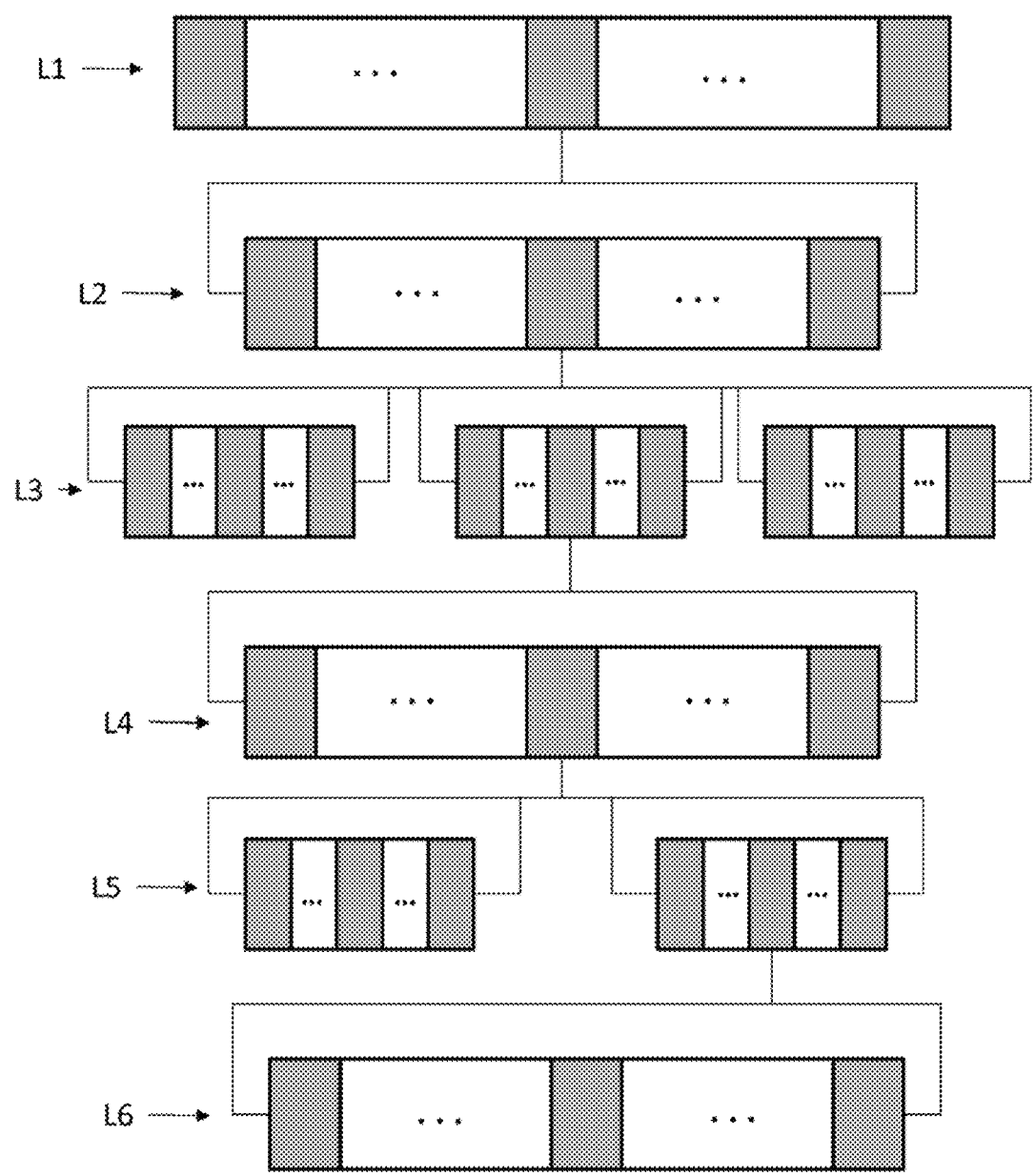
FIG. 4A is a diagram of general partitions and sections of codebooks in accordance with aspects of the invention.

Referring next to FIG. 4A, a general example of a codebook structure is shown. A codebook may have many levels (e.g., L1-L6), and the number of levels may be determined by the bit number size, alphabet size, or other factors as will be understood by those of skill in the art from the description herein. Each level may have a number of sections, as shown by the shaded blocks. These sections may include further partitions with numbers of sections, and so on.

Figures 4B, 4C:
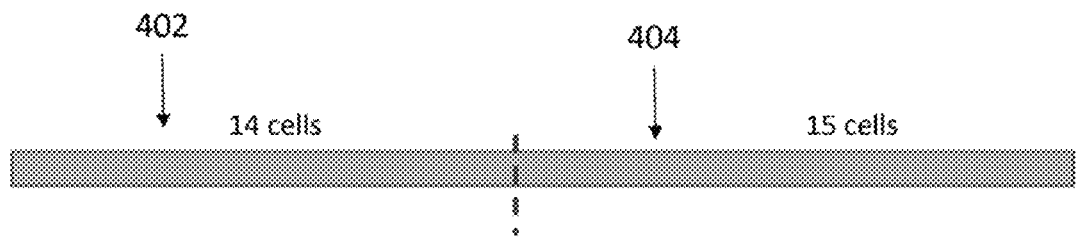
FIGS. 4B and 4C show partitioning in accordance with aspects of the invention.

Methods and processes for partitioning a codebook (or a section of a codebook) will be described with respect to FIGS. 4B and 4C. Properties of binomial coefficients may be used. For example, the Chu-Vandermonde identity may be represented as $(^nC_k) = \Sigma_{j=0,\ldots,k} (^mC_j)(^{n-m}C_{k-j})$, where m can be any integer less than n. For example, in a codebook for a 29 bit number:

$$(^{29}C_6) = (^{14}C_0)(^{15}C_6) + (^{14}C_1)(^{15}C_5) + (^{14}C_2)(^{15}C_4) + (^{14}C_3)(^{15}C_3) + (^{14}C_4)(^{15}C_2) + (^{14}C_5)(^{15}C_1) + (^{14}C_6)(^{15}C_0).$$

As such, the 29 cells may be split into two partitions, a first partition 402 of 14 cells and a second partition 404 of 15 cells. The combinations and possibilities are shown in the graph 406 of FIG. 4C.

The Chu-Vandermonde identity may be applied recursively to break down $(^nC_k)$ until each term in the expansion is less than 256. For example, $(^{14}C_3)$, $(^{14}C_4)$, $(^{14}C_5)$, $(^{14}C_6)$ and $(^{15}C_3)$, $(^{15}C_4)$, $(^{15}C_5)$, $(^{15}C_6)$ are larger than 256. However, $$(^{15}C_6) = (^7C_0)(^8C_6) + (^7C_1)(^8C_5) + (^7C_2)(^8C_4) + (^7C_3)(^8C_3) + (^7C_4)(^8C_2) + (^7C_5)(^8C_1) + (^7C_6)(^8C_0), \text{ and}$$

$$(^{14}C_6) = (^7C_0)(^7C_6) + (^7C_1)(^7C_5) + (^7C_2)(^7C_4) + (^7C_3)(^7C_3) + (^7C_4)(^7C_2) + (^7C_5)(^7C_1) + (^7C_6)(^7C_0), \text{ and so on.}$$

m can be chosen strategically so that terms in the expansions can be reused. The final terms will be the codebooks.

The example that is disclosed below is described with respect to a particular codebook size for a set of chosen variables. This is only done for illustration in describing the invention, and the invention is not limited to the particular details of the example described below.

Referring next to FIGS. 5A-26, a design and functionality of a 57/58 encoder (such as encoder 180 of FIG. 1A) is disclosed.

Figure 5A:
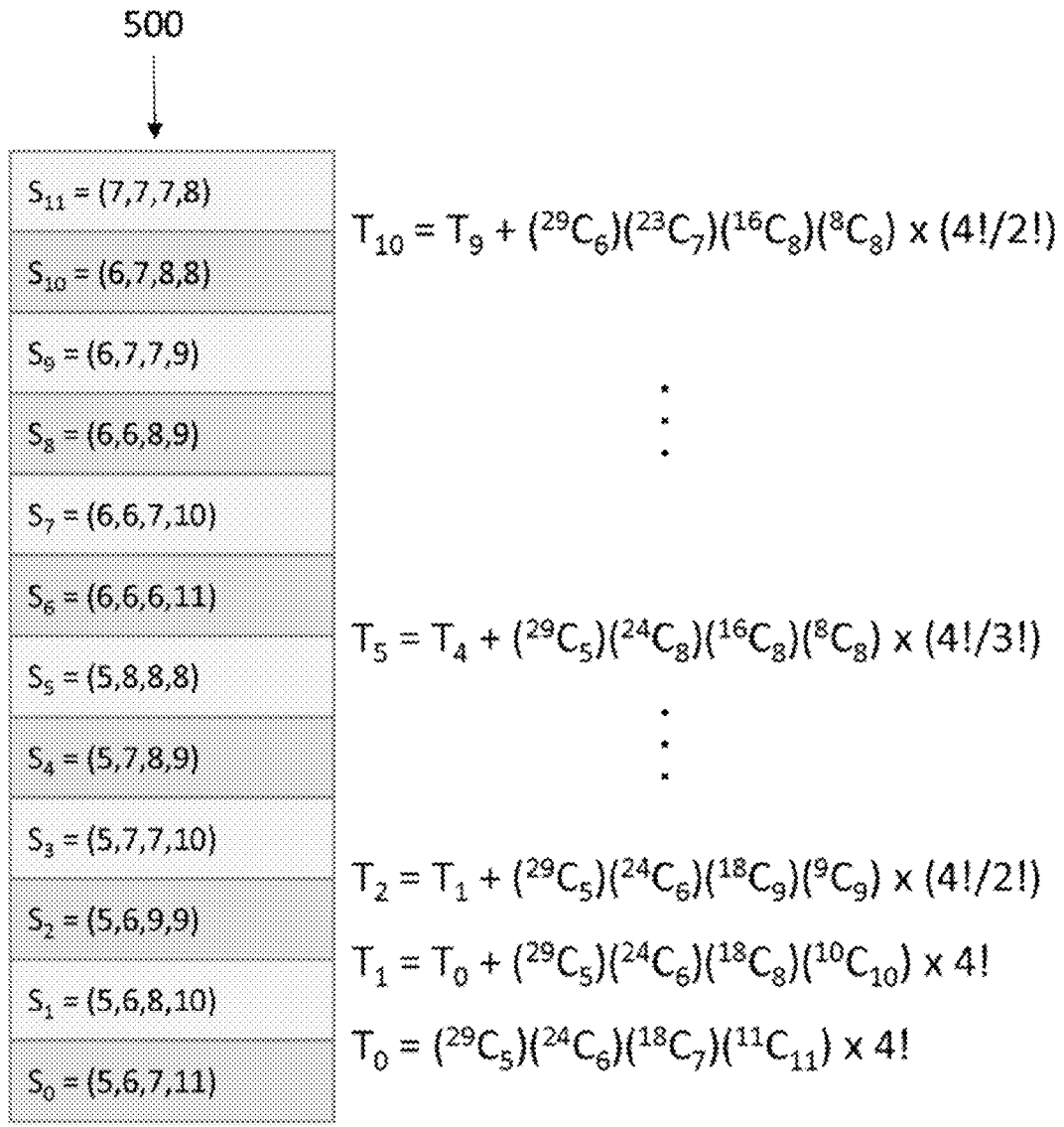
FIGS. 5A, 5B, 6, 7, 8, 9, 10, 11, 12, 13, 14, 15, 16, 17, 18, 19, 20, 21, 22, 23, 24, 25, and 26 are diagrams showing a process for encoding and partitioning codebooks according to aspects of the invention.
Figure 5B:
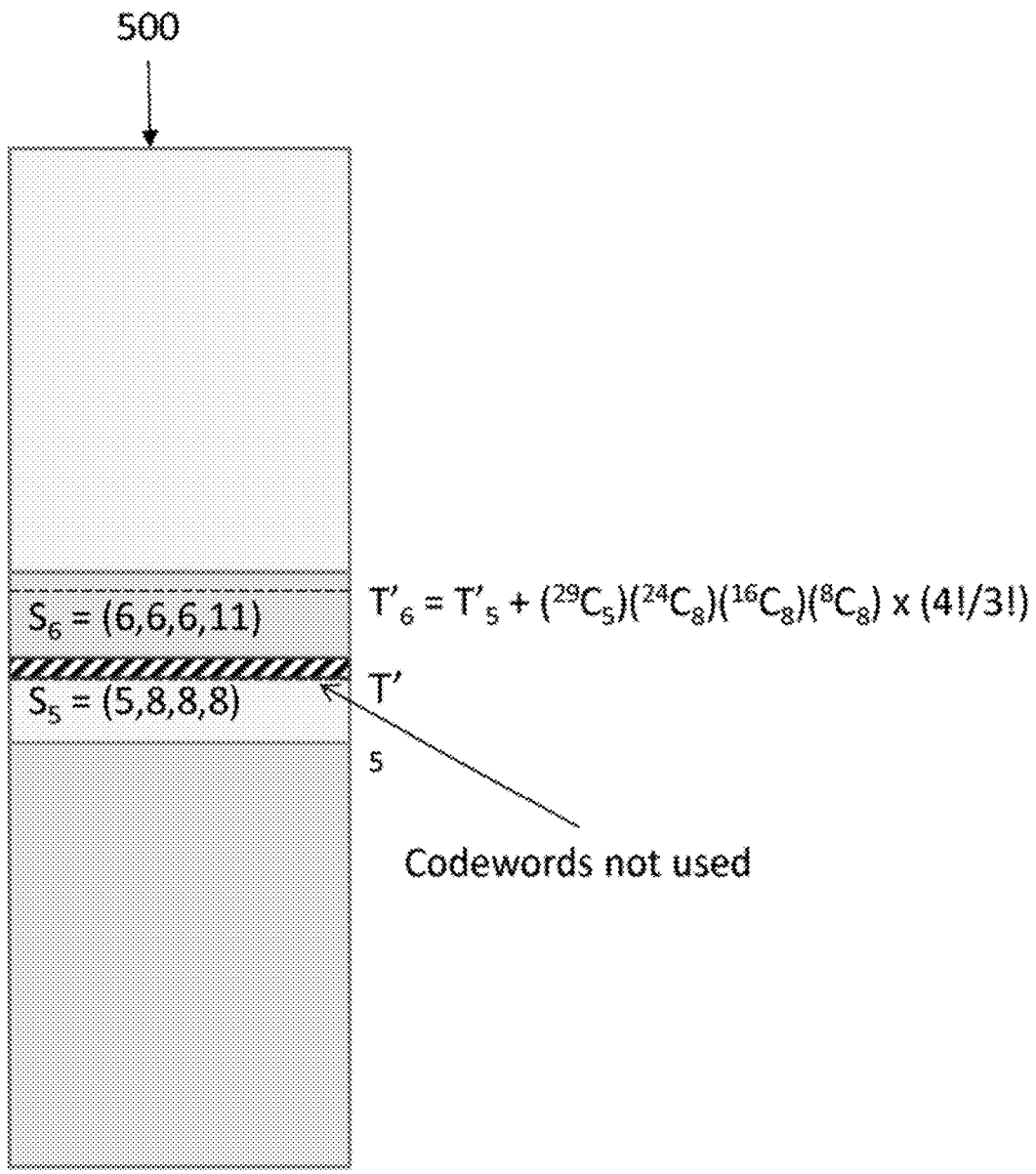

In FIG. 5A, a codebook 500 is shown with a number of sections (S0-S11). Thresholds (T0 . . . T10) determine separation of the sections. As shown in FIG. 5B, thresholds may be based on codewords not used. Without bit-width optimization, all thresholds may be stored as 57-bit numbers (total storage size is 1340 bytes). Since the number of available codewords is greater than 2^57, it is possible to smartly remove some codewords to reduce the threshold bit-width. For example, if the 30 least significant bits in T5 are forced to the 0 value, a maximum of 2^30−1 codewords will be removed. Thus, the bit-width of the new threshold T'5 is 27, since only the 27 most significant bits need to be stored. T6 through T10 should be shifted down by the same amount, and threshold in subsequent levels also need to be adjusted.

Referring back to FIG. 5A, given a 57-bit number $X_0$, i.e., $X_0$ chosen from $[0, 2^{57}-1]$, it is determined which section of the codebook $X_0$ maps to. If $X_0 < T_0$, $X_0$ maps to $S_0$. If $T_0 \leq X_0 < T_1$, $X_0$ maps to $S_1$. If $T_1 \leq X_0 < T_2$ $X_0$ maps to $S_2$ . . . If $T_9 \leq X_0 < T_{10}$, $X_0$ maps to $S_{10}$. If $T_{10} \leq X_0$, $X_0$ maps to $S_{11}$. If $X_0$ maps to $S_k$, compute $X_1 = X_0 - T_{k-1}$ (assume $T_{-1} = 0$) (of note the codebook contains more than $2^{57}$ codewords).

Figure 6:
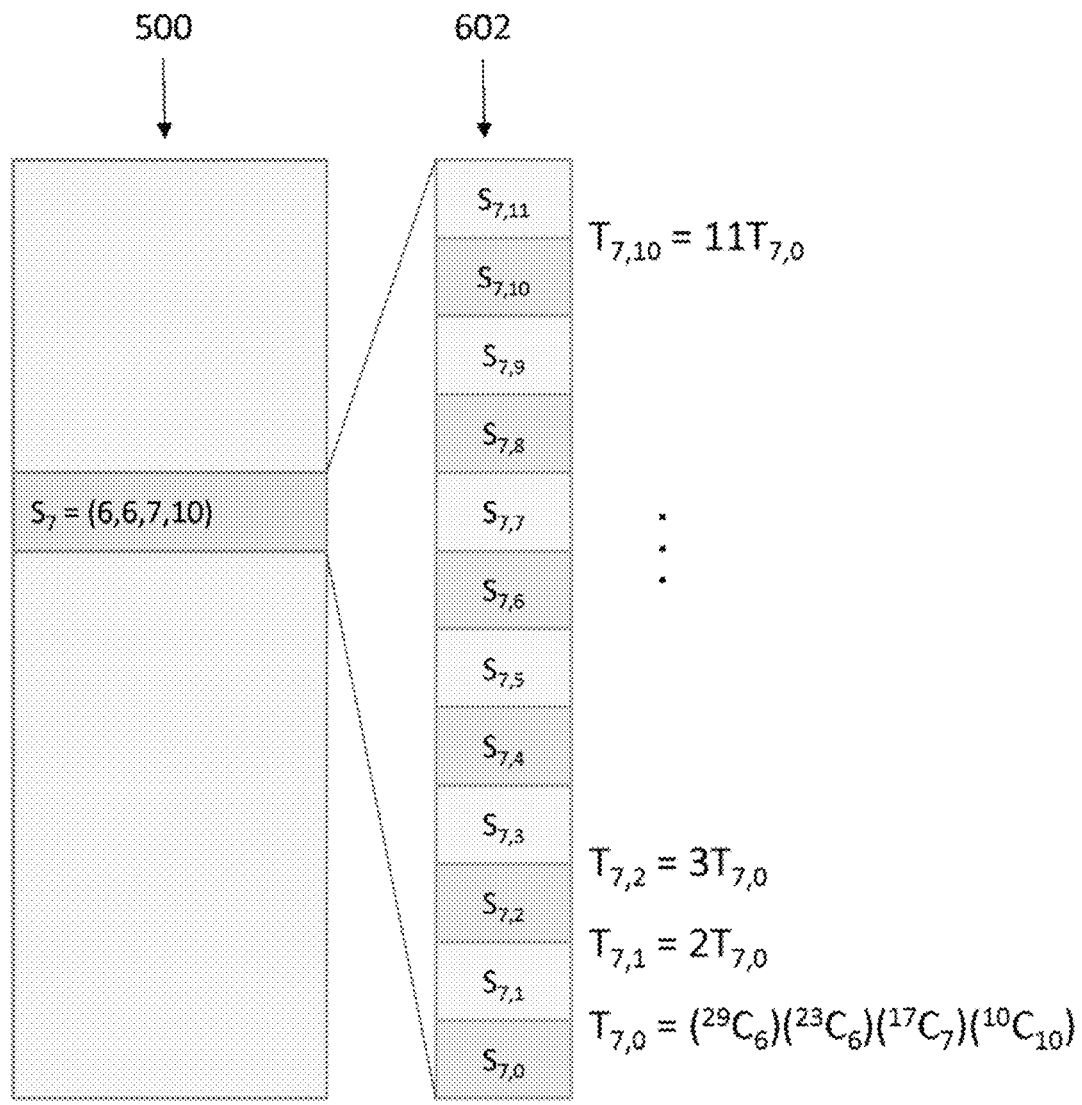

At FIG. 6, it is assumed that $X_0$ maps to $S_7$, such that $X_1 = X_0 - T_6$. As shown, $S_7$ of codebook 500 also include multiple sections 600. Thus, it is then determined, within $S_7$, which section of the codebook $X_1$ maps to. Each section corresponds to one of the 12 permutations ({(a,a,b,c), (a,b,a,c), (a,b,c,a), . . . }). Each section contains the same number of codewords. Thus, to make this determination, $X_{1-1}$=floor $(X_1/T_{7,0})$, $X_2 = X_1 - X_{1-1} T_{7,0}$, and thus, $X_{1-1}$ is the index of the section $X_1$ maps to. There are only 3 permutation values: {4, 12 24}. These permutations need to be stored and can be shared among $\{S_k\}$.

Figure 7:
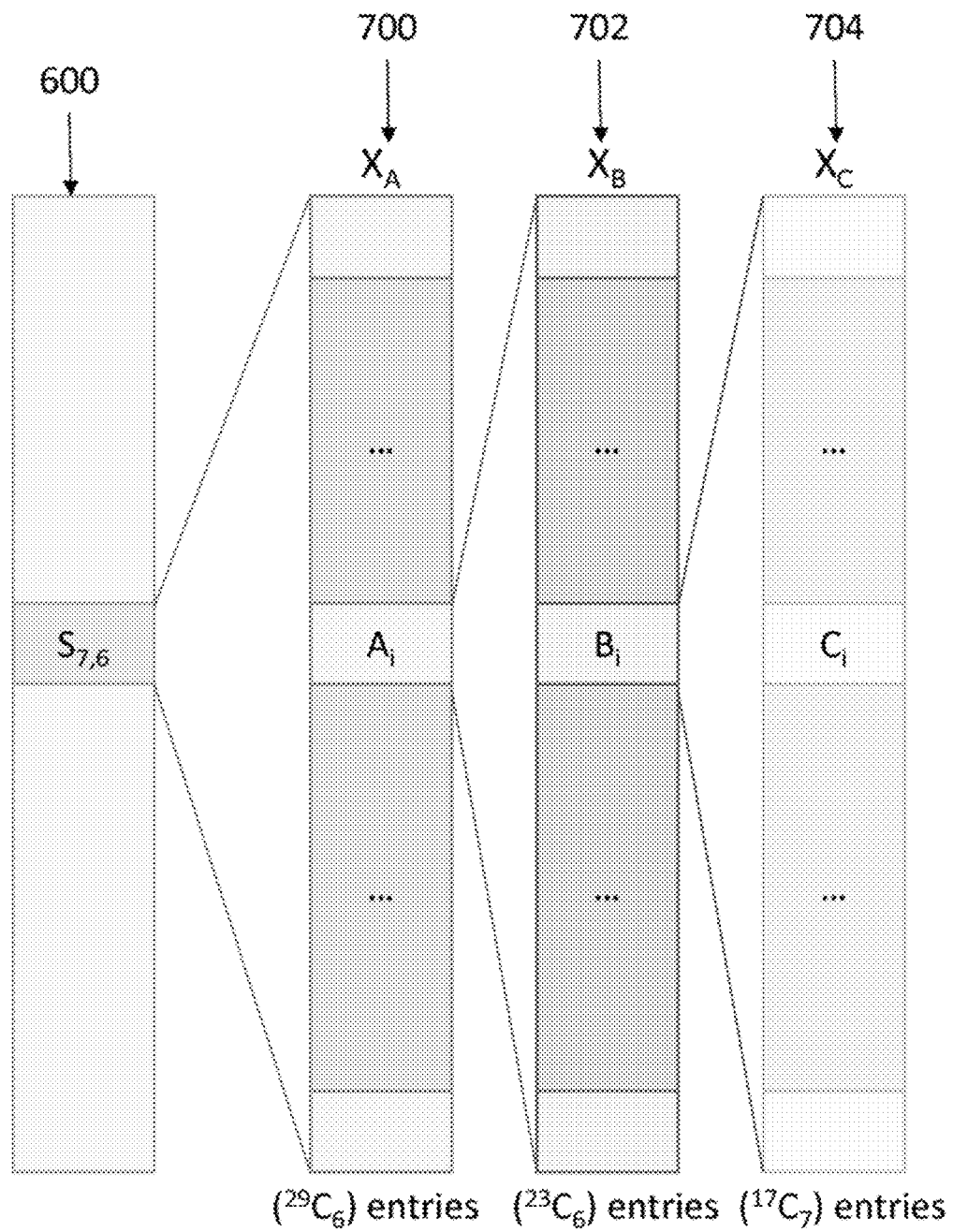

Referring next to FIG. 7, $S_{7,6}$ includes multiple sections, section 700, which has $(^{29}C_6)$ entries, section 702, which has ($^{23}C_6$) entries, and section 704, which has ($^{17}C_7$) entries. Assume $X_1$ maps to $S_{7,6}$, $X_2=X_1-X_{1-1}$ $T_{7,0}$ where $X_{1-1}=6$ and assume $S_{7,6}$ corresponds to permutation (0,3,1,2). Then, the entries in $S_{7,6}$ are stored with the three sections 700, 702, and 704. Section 700 contains ($^{29}C_6$) entries. Each entry is 29 bits in length and represents one way of selecting 6 cells out of 29 cells for level 0. Section 702 contains ($^{23}C_6$) entries. Each entry is 23 bits in length and represents one way of selecting 6 cells out of 23 cells for level 3. The 23 cells correspond to the cells not selected in the section 700. Section 704 contains ($^{17}C_7$) entries. Each entry is 17 bits in length and represents one way of selecting 7 cells out of 17 cells for level 1. The 17 cells correspond to the cells not selected in the sections 700 and 702. There is no need for a fourth section as the 10 cells not selected in sections 700, 702, and 704 are for level 2.

The indexes next need to be computed for each section. Index for section 700 is $X_A=\text{floor}(X_2/(^{23}C_6)(^{17}C_7))$. Index for section 702 is $X_{A-R}=X_2-X_A$ $(^{23}C_6)(^{17}C_7)$, $X_B=\text{floor}(X_{A-R}/(^{17}C_7))$. Index for section 704 is $X_C=X_{A-R}-X_B(^{17}C_7)$.

As can be seen, all three sections 700, 702, and 704 are still too large (e.g., $(^{29}C_6)=475020$). Thus, using the identity described above, the sections may be further partitioned.

Figure 8:
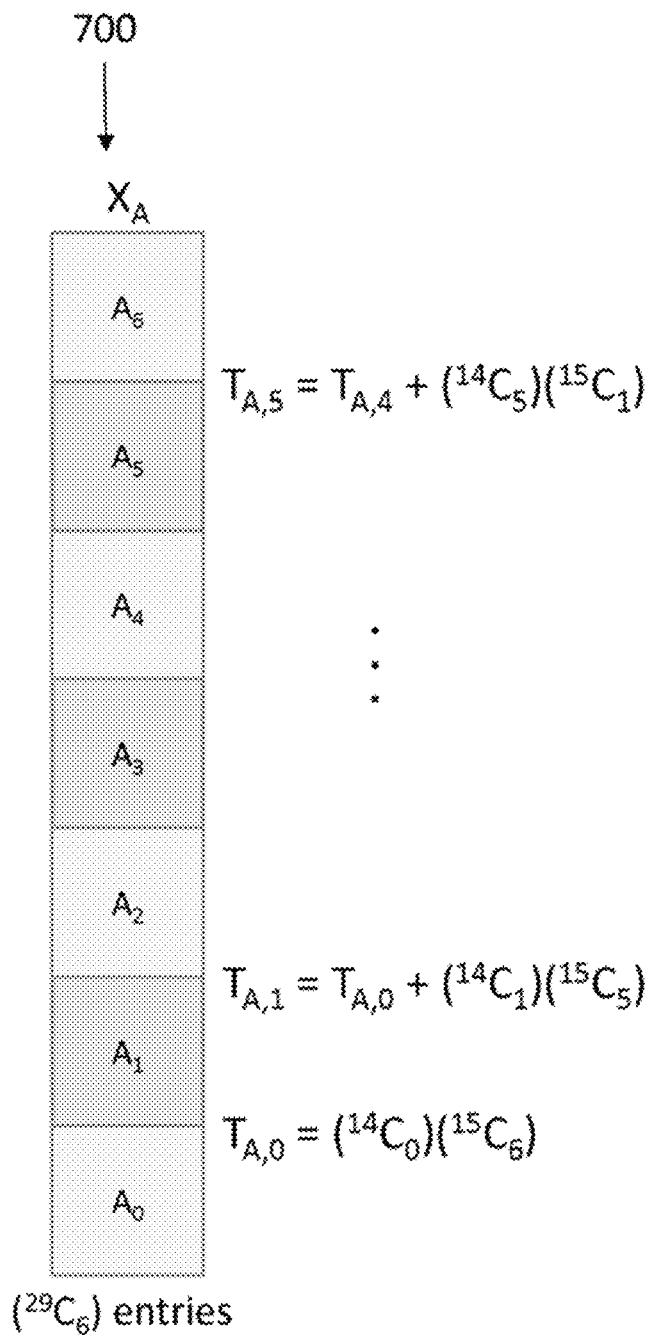
Figure 9:
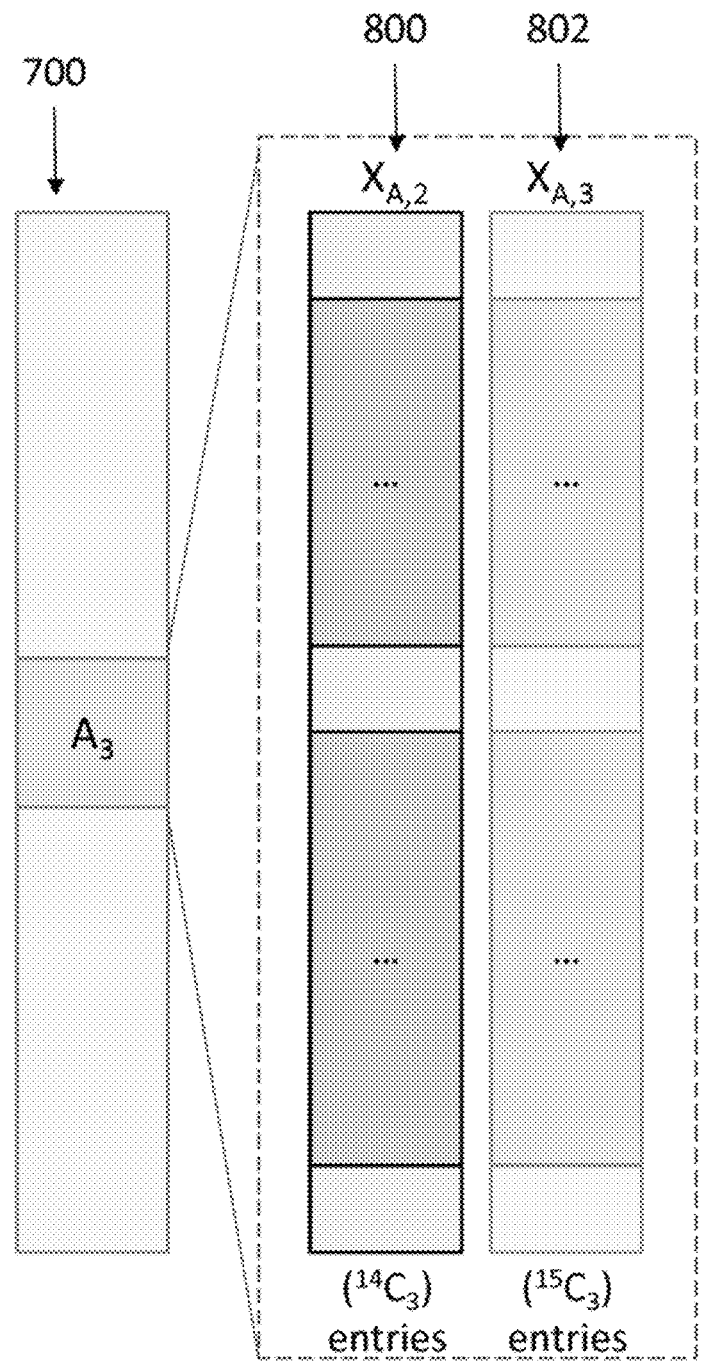

As seen in FIGS. 8 and 9, the identity is applied to break down section 700. Then, it is determined which part of the section 700 $X_A$ maps to. If $X_A<T_{A,0}$, $X_A$ maps to $A_0$. If $T_{A,0}\leq X_A<T_{A,1}$, $X_A$ maps to $A_1$, ... If $T_{A,4}\leq X_A<T_{A,5}$, $X_A$ maps to $A_5$. If $T_{A,5}\leq X_A$, $X_A$ maps to $A_6$. If $X_A$ maps to $A_k$, compute $X_{A,1}=X_A-T_{A,k-1}$ (assume $T_{A,-1}=0$).

If $X_A$ maps to $A_3$, $X_{A,1}=X_A-T_{A,2}$. Next, the entries in $A_3$ are stored with 2 codebooks 800 and 802 (FIG. 9). Codebook 800 contains $(^{14}C_3)$ entries and codebook 802 contains $(^{15}C_3)$ entries. Next, $X_{A,2}$ is computed as $\text{floor}(X_{A,1}/(^{15}C_3))$ and $X_{A,3}$ is computed as $X_{A,1}-X_{A,2}$ $(^{15}C_3)$.

Figure 10:
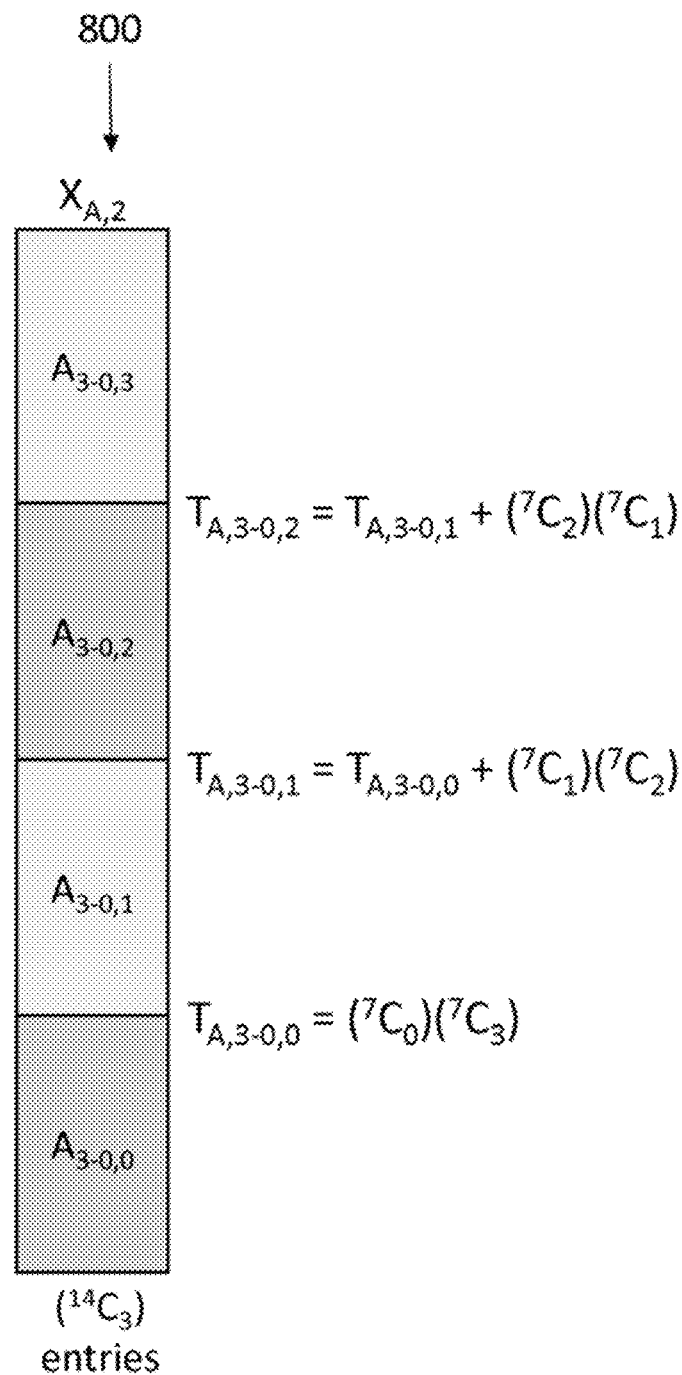
Figure 11:
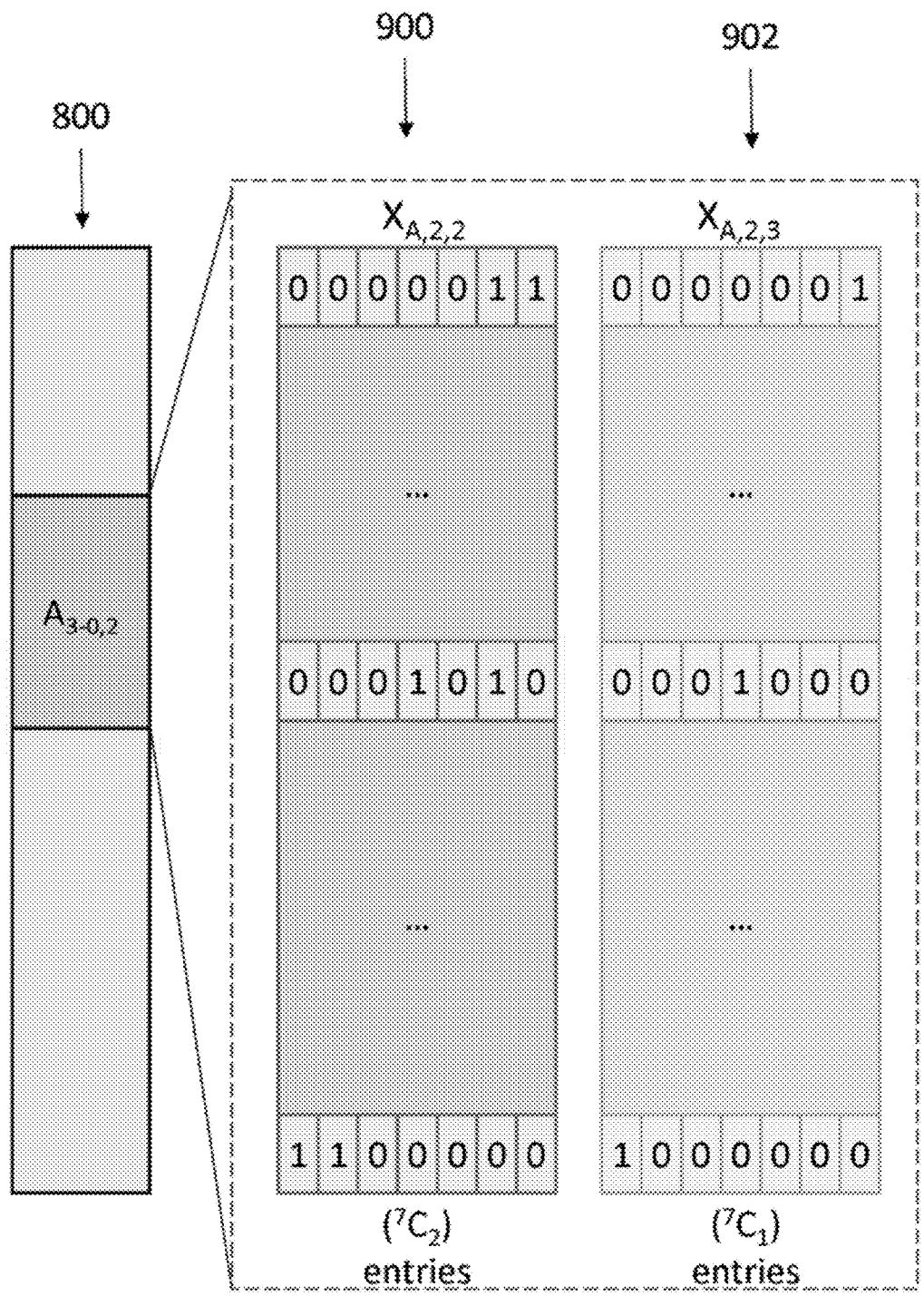

Codebook 800 is still too large, so it needs to be broken down, as shown in FIGS. 10 and 11. Then, it is determined which section of the codebook 800 $X_{A,2}$ maps to. If $X_{A,2}<T_{A,3-0,0}$, $X_{A,2}$ maps to $A_{3-0,0}$. If $T_{A,3-0,0}\leq X_{A,2}<T_{A,3-0,1}$, $X_{A,2}$ maps to $A_{3-0,1}$. If $T_{A,3-0,1}\leq X_{A,2}<T_{A,3-0,2}$, $X_{A,2}$ maps to $A_{3-0,2}$. If $T_{A,3-0,2}\leq X_{A,2}$, $X_{A,2}$ maps to $A_{3-0,3}$. If $X_{A,2}$ maps to $A_{3-0,k}$, compute $X_{A,2,1}=X_{A,2}-T_{A,3-0,k-1}$ (assume $T_{A,3-0,-1}=0$).

If $X_{A,2}$ maps to $A_{3-0,2}$, $X_{A,2,1}=X_{A,2}-T_{A,3-0,1}$. Each of the sections may include two further codebooks 900 and 902, as seen in FIG. 11. Store the entries in $A_{3-0,2}$ with the two codebooks 900 and 902. Codebook 900 contains $(^7C_2)$ entries, with each entry being 7 bits in length and representing one way of selecting 2 cells out of 7 cells. Codebook 902 contains $(^7C_1)$ entries, with each entry being 7 bits in length and representing one way of selecting 1 cell out of 7 cells. Next, compute $X_{A,2,2}=\text{floor}(X_{A,2,1}/(^7C_1))$, $X_{A,2,3}=X_{A,2,1}-X_{A,2,2}(^7C_1)$. There is no need to further break down codebooks 900 and 902, $X_{A,2,2}$ is the index for selecting from codebook 900 and $X_{A,2,3}$ is the index for selecting from codebook 902.

Figure 12:
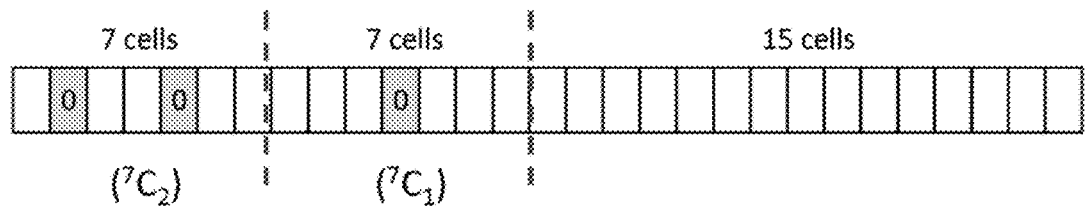

The selected cells are then mapped back to the original cells, as shown in FIG. 12.

Figure 13:
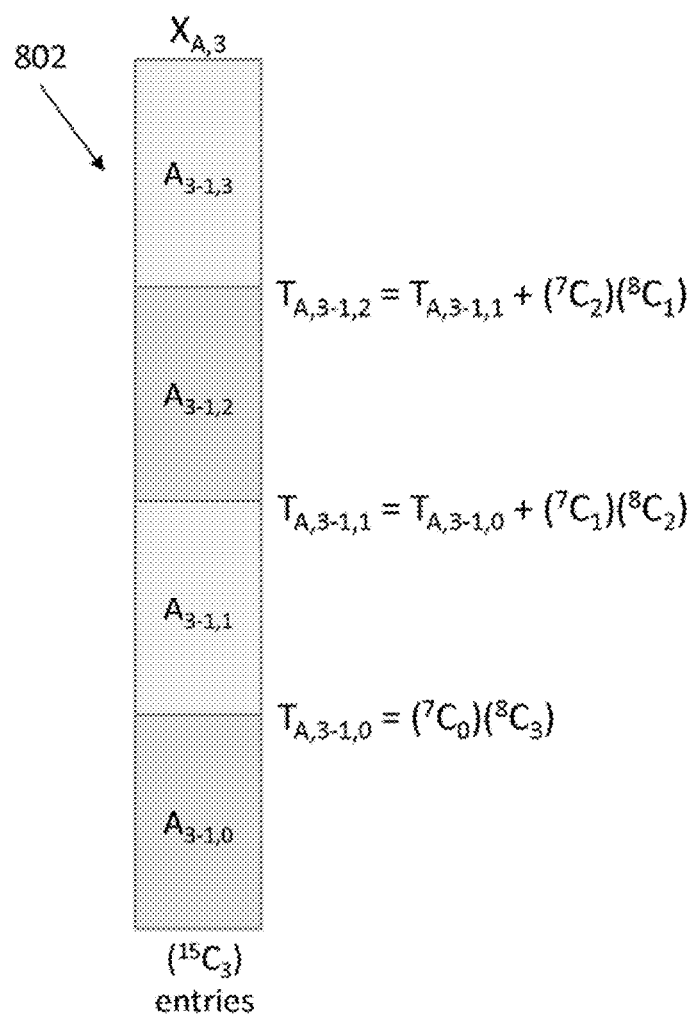
Figure 14:
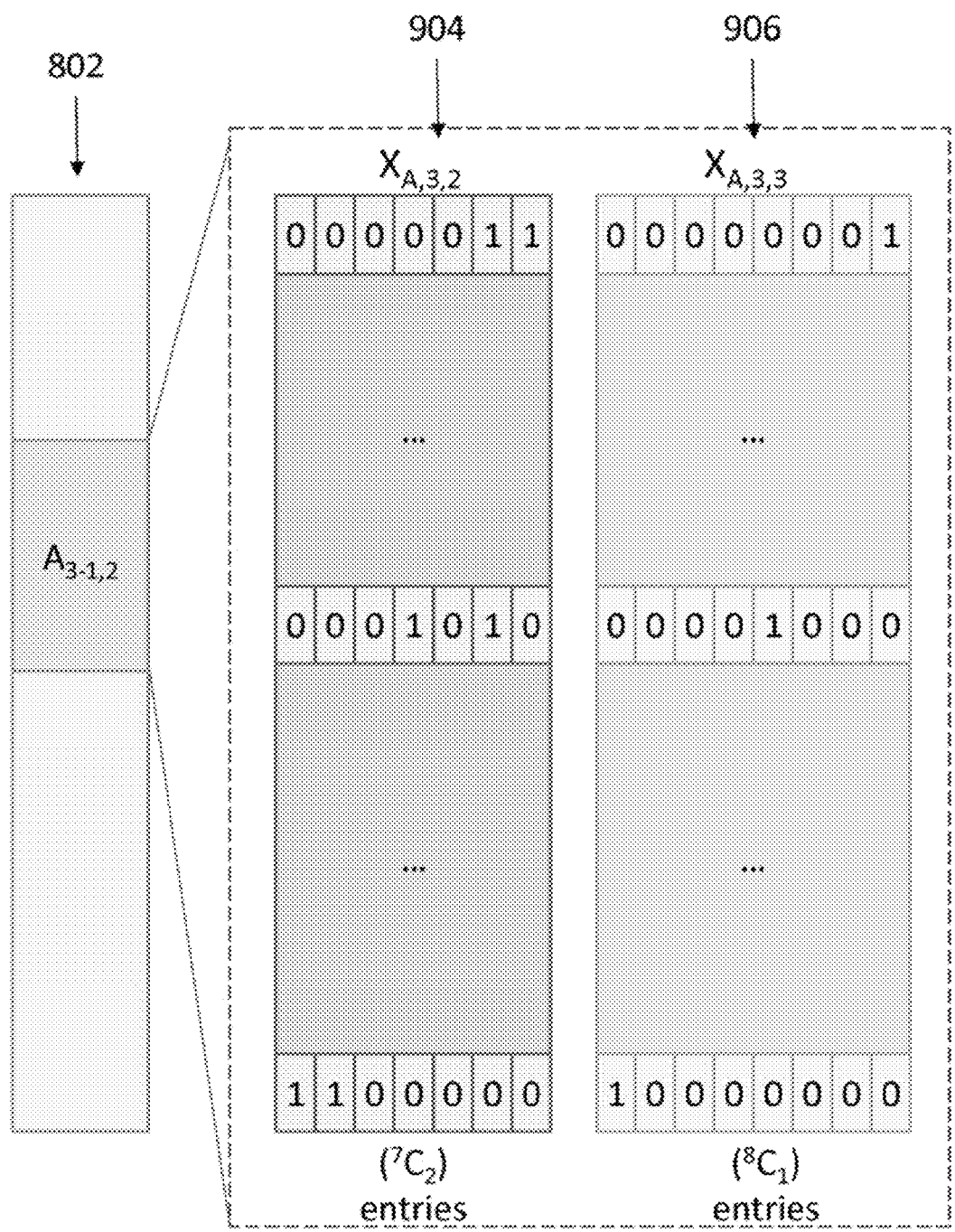

Next, the codebook 802 is broken down further (FIGS. 13 and 14). It is determined which section of the codebook 802 $X_{A,3}$ maps to. If $X_{A,3}<T_{A,3-1,0}$, $X_{A,3}$ maps to $A_{3-1,0}$. If $T_{A,3-1,0}\leq X_{A,3}<T_{A,3-1,1}$, $X_{A,3}$ maps to $A_{3-1,1}$. If $T_{A,3-1,1}\leq X_{A,3}\leq T_{A,3-1,2}$, $X_{A,3}$ maps to $A_{3-1,2}$. If $T_{A,3-1,2}\leq X_{A,3}$, $X_{A,3}$ maps to $A_{3-1,3}$. If $X_{A,3}$ maps to $A_{3-1,k}$, compute $X_{A,3,1}=X_{A,3}-T_{A,3-1,k-1}$ (assume $T_{A,3-1,-1}=0$).

As seen in FIG. 14, the section of codebook 802 is broken down into codebooks 904 and 906. If $X_{A,3}$ maps to $A_{3-1,2}$, $X_{A,3,1}=X_{A,3}-T_{A,3-1,1}$. Next, store the entries in $A_{3-1,2}$ with codebooks 904 and 906, Codebook 904 contains $(^7C_2)$ entries, with each entry being 7 bits in length and representing one way of selecting 2 cells out of 7 cells. Codebook 906 contains $(^8C_1)$ entries, with each entry being 8 bits in length and representing one way of selecting 1 cell out of 8 cells. Next, compute $X_{A,3,2}=\text{floor}(X_{A,3,1}/(^8C_1))$, $X_{A,3,3}=X_{A,3,1}-X_{A,3,2}(^8C_1)$. There is no need to further break down the codebooks 904 and 906. $X_{A,3,2}$ is the index for selecting from the codebook 904. $X_{A,3,3}$ is the index for selecting from the codebook 906.

Figure 15:
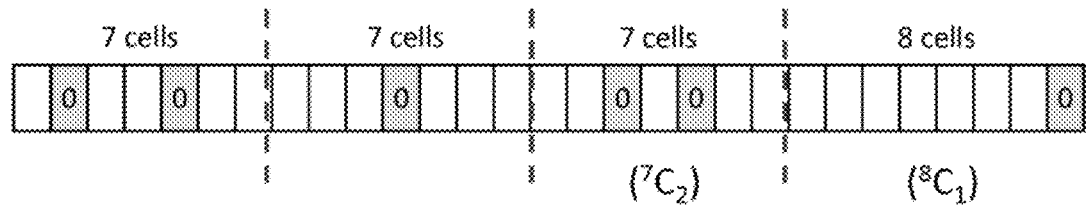

The selected cells may be mapped back to the original cells, as shown in FIG. 15.

Figure 16:
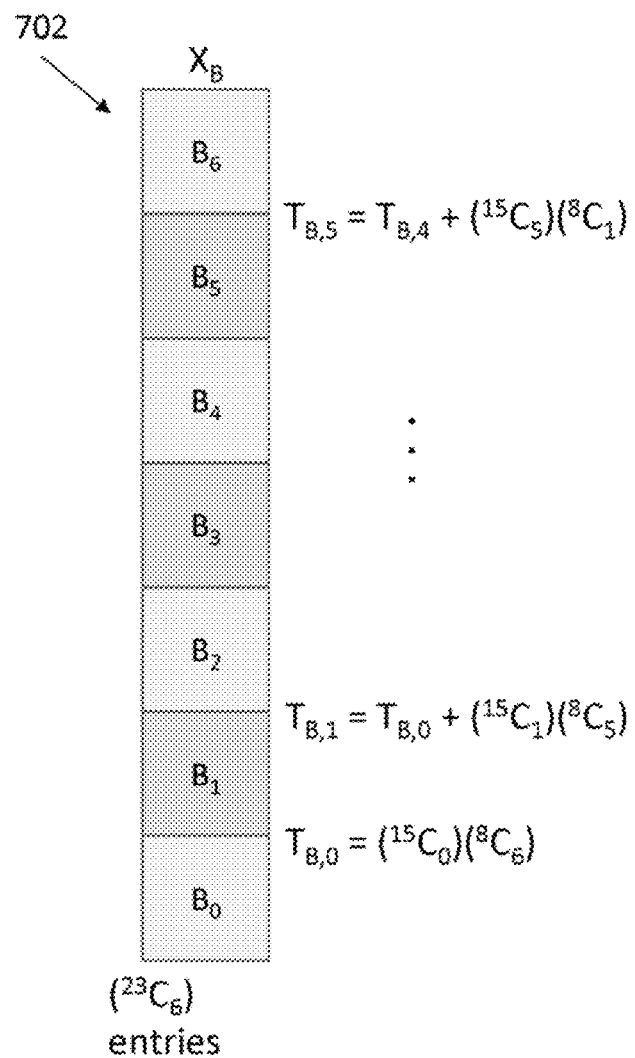

Referring to FIG. 16, section 702 is broken down. Then it is determined which section of the section 702 $X_B$ maps to. If $X_B<T_{B,0}$, $X_B$ maps to $B_0$. If $T_{B,0}\leq X_B<T_{B,1}$, $X_B$ maps to $B_1$. ... If $T_{B,4}\leq X_B<T_{B,5}$, $X_B$ maps to $B_5$. If $T_{B,5}\leq X_B$, $X_B$ maps to $B_6$. If $X_B$ maps to $B_k$, compute $X_{B,1}=X_B-T_{B,k-1}$ (assume $T_{B,-1}=0$).

Figure 17:
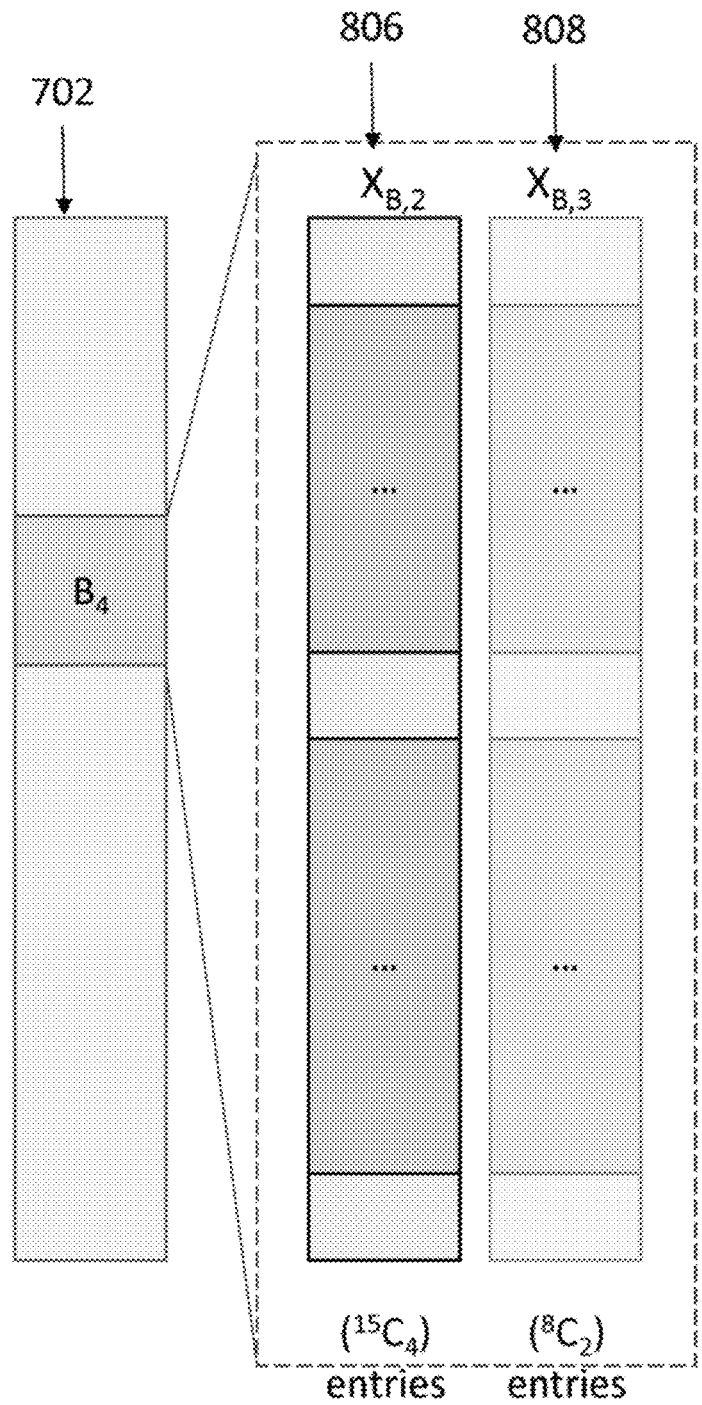

As seen in FIG. 17, a section of section 702 is broken down into codebooks 806 and 808. If $X_B$ maps to $B_4$, $X_{B,1}=X_B-T_{B,3}$. Next, store the entries in $B_4$ with codebooks 806 and 808. Codebook 806 contains $(^{15}C_4)$ entries and codebook 808 contains $(^8C_2)$ entries. Then compute $X_{B,2}=\text{floor}(X_{B,1}/(^8C_2))$, $X_{B,1}=X_{B,1}-X_{B,2}(^8C_2)$.

Codebook 806 needs to be further broken down. Then, it is determined which section of the codebook 806 $X_{B,2}$ maps to. If $X_2<T_{B,4-0,0}$, $X_{B,2}$ maps to $B_{4-0,0}$. If $T_{B,4-0,0}\leq X_{B,2}<T_{B,4-0,1}$, $X_{B,2}$ maps to $B_{4-0,1}$. ... If $T_{B,4-0,2}\leq X_{B,2}<T_{B,4-0,3}$, $X_{B,2}$ maps to $B_{4-0,3}$. If $T_{B,4-0,3}\leq X_{B,2}$, $X_{B,2}$ maps to $B_{4-0,4}$. If $X_{B,2}$ maps to $B_{4-0,k}$ compute $X_{B,2,1}=X_{B,2}-T_{B,4-0,k-1}$ (assume $T_{B,4-0,-1}=0$).

Figure 18:
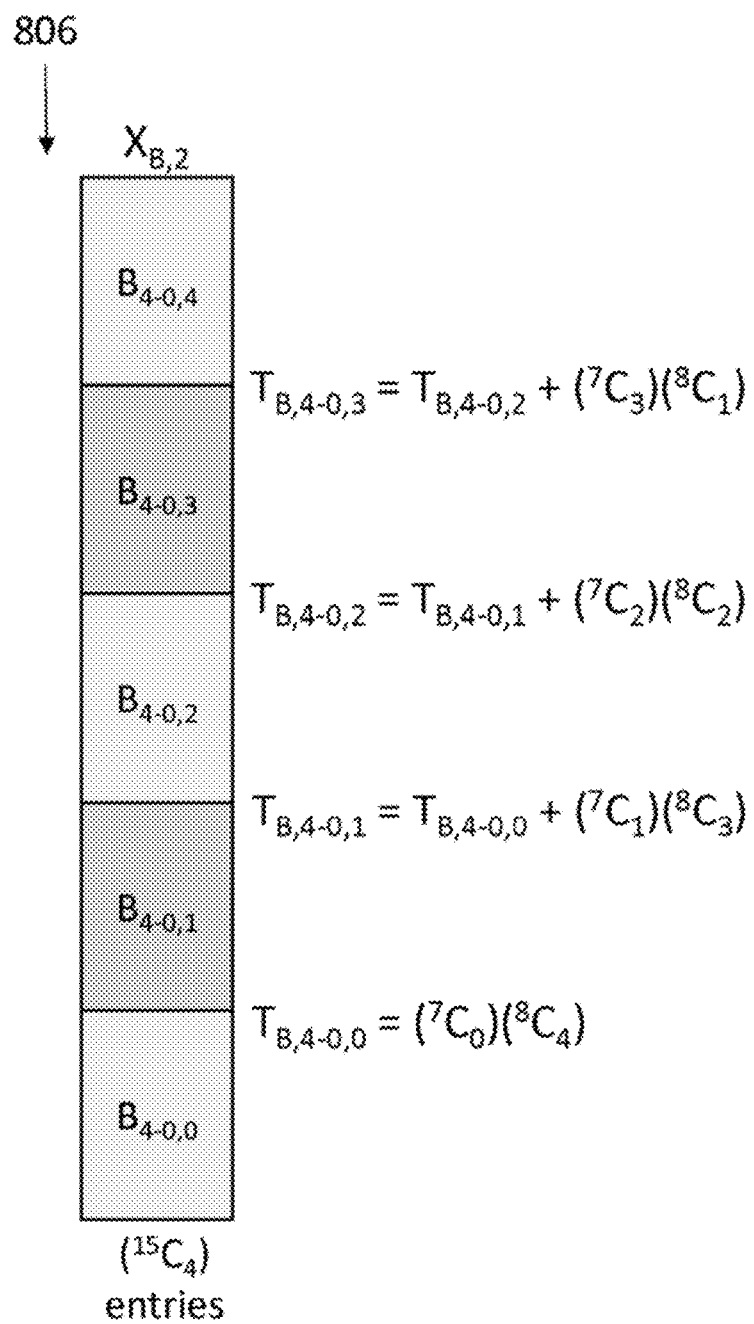
Figure 19:
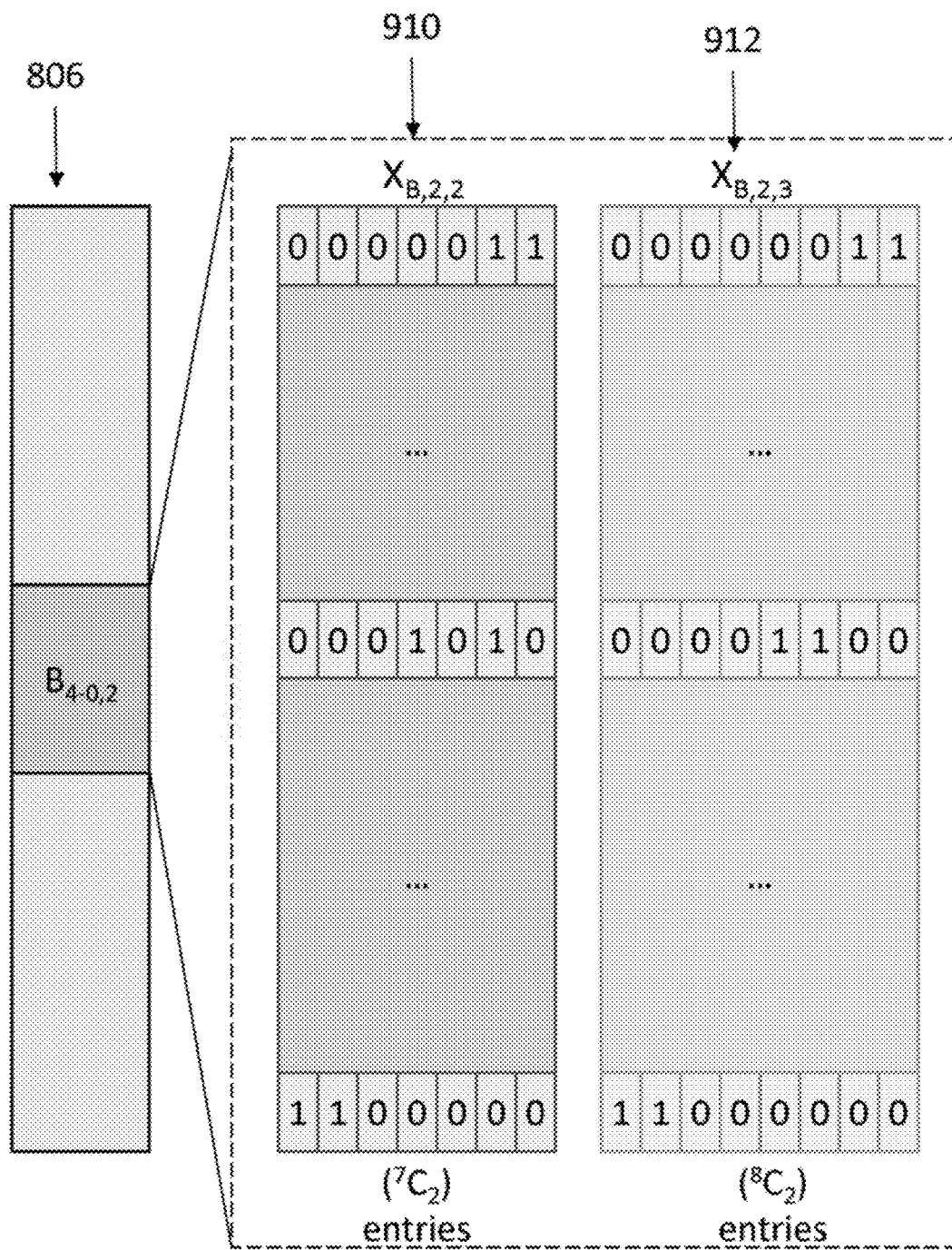

The section of codebook 806 further contains codebook 910 and 912, as seen in FIGS. 18-19. If $X_{B,2}$ maps to $B_{4-0,2}$, $X_{B,4-0,2}$, $X_{B,2}-T_{B,4-0,1}$. Then, store the entries in $B_{4-0,2}$ with the codebooks 910 and 912. Codebook 910 contains $(^7C_2)$ entries, with each entry being 7 bits in length and representing one way of selecting 2 cells out of 7 cells. Codebook 912 contains $(^8C_2)$ entries, with each entry being 8 bits in length and representing one way of selecting 2 cells out of 8 cells. Then compute $X_{B,2,2}=\text{floor}(X_{B,2,1}/(^8C_2))$, $X_{B,2,3}=X_{B,2,2}(^8C_2)$. There is no need to further break down the codebooks 910 and 912. $X_{B,2,2}$ is the index for selecting from the codebook 910. $X_{B,2,3}$ is the index for selecting from the codebook 912.

Figure 20:
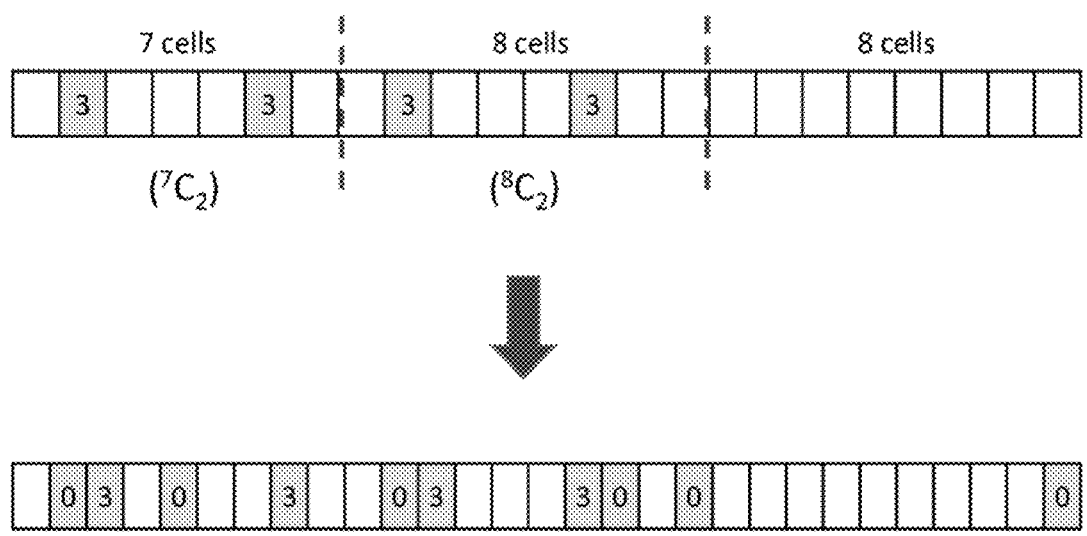

The selected cells are then mapped back to the original cells, as shown in FIG. 20.

Figure 21:
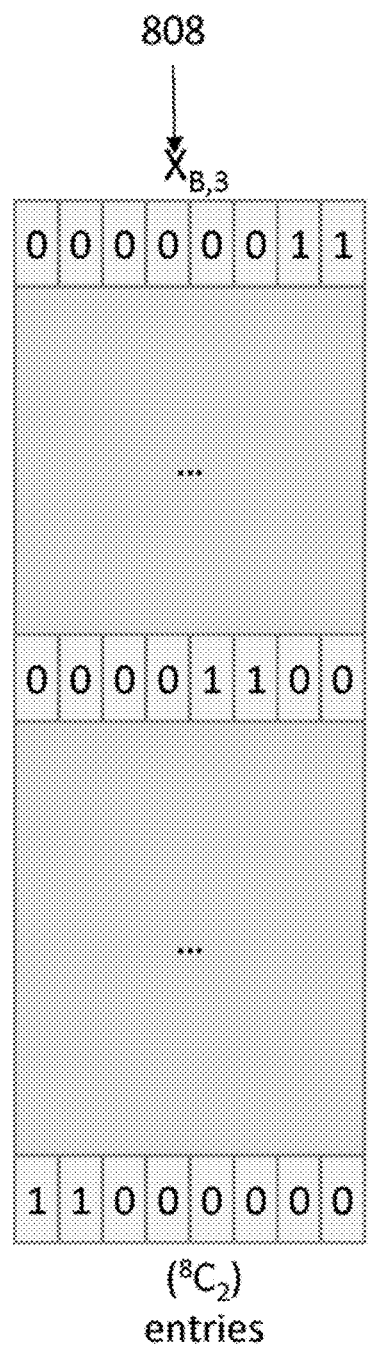
Figure 22:
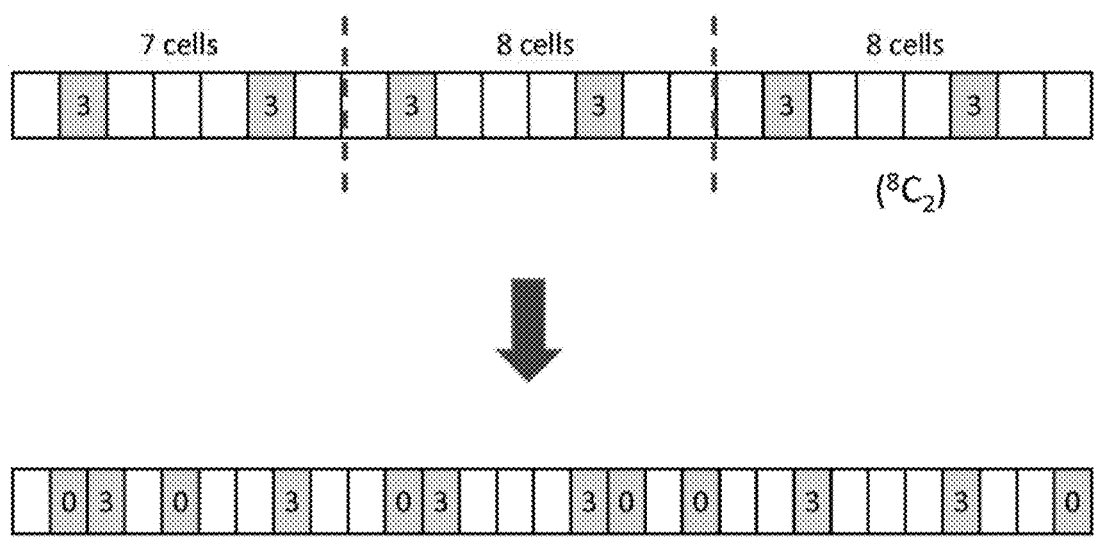

Codebook 808 does not need to be broken down further, as it is the index for selecting from the codebook (FIG. 21). Thus, the selected cells from codebook 808 may be mapped back to the original cells, as shown in FIG. 22.

Figure 23:
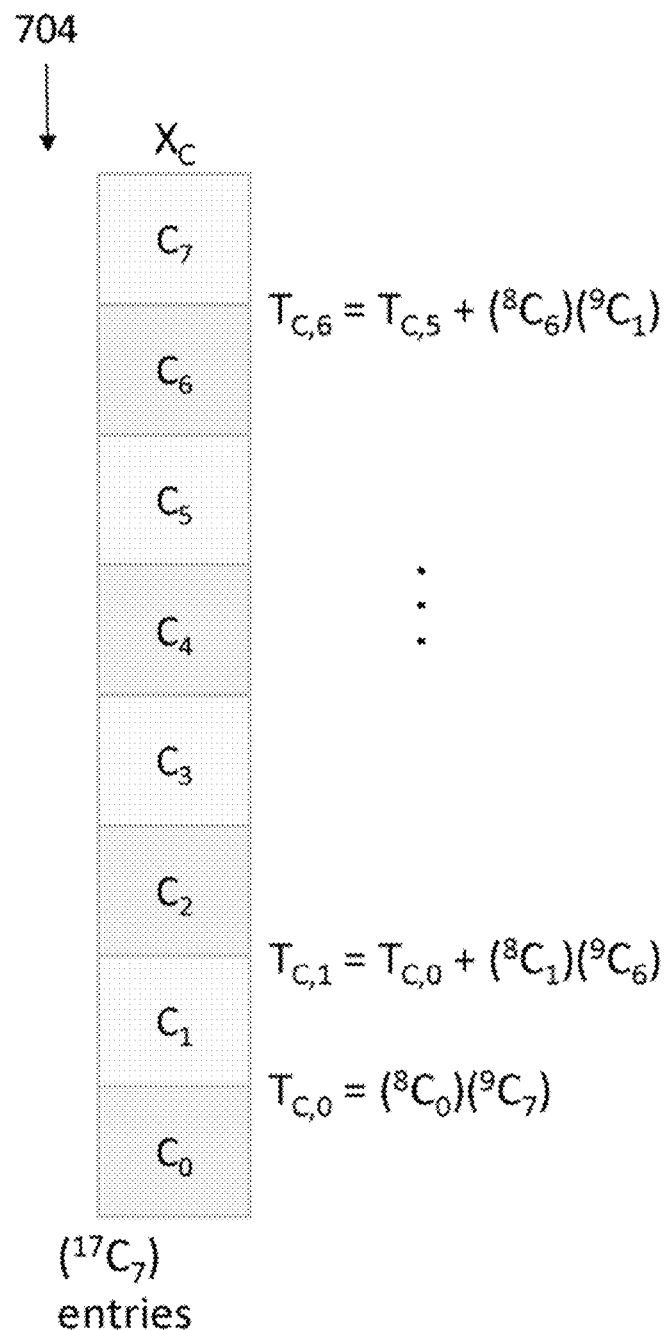

As shown in FIG. 23, section 704 needs to be further broken down. Then, it is determined which section of the codebook 704 $X_C$ maps to. If $X_C<T_{C,0}$, $X_C$ maps to $C_0$. If $T_{C,0}\leq X_C<T_{C,1}$, $X_C$ maps to $C_1$. ... If $T_{C,5}\leq X_C<T_{C,6}$. $X_C$ maps to $C_6$. If $T_{C,6}\leq X_C$, $X_C$ maps to $C_7$. If $X_C$ maps to $C_k$, compute $X_{C,1}=X_C-T_{C,k-1}$ (assume $T_{C,-1}=0$).

Figure 24:
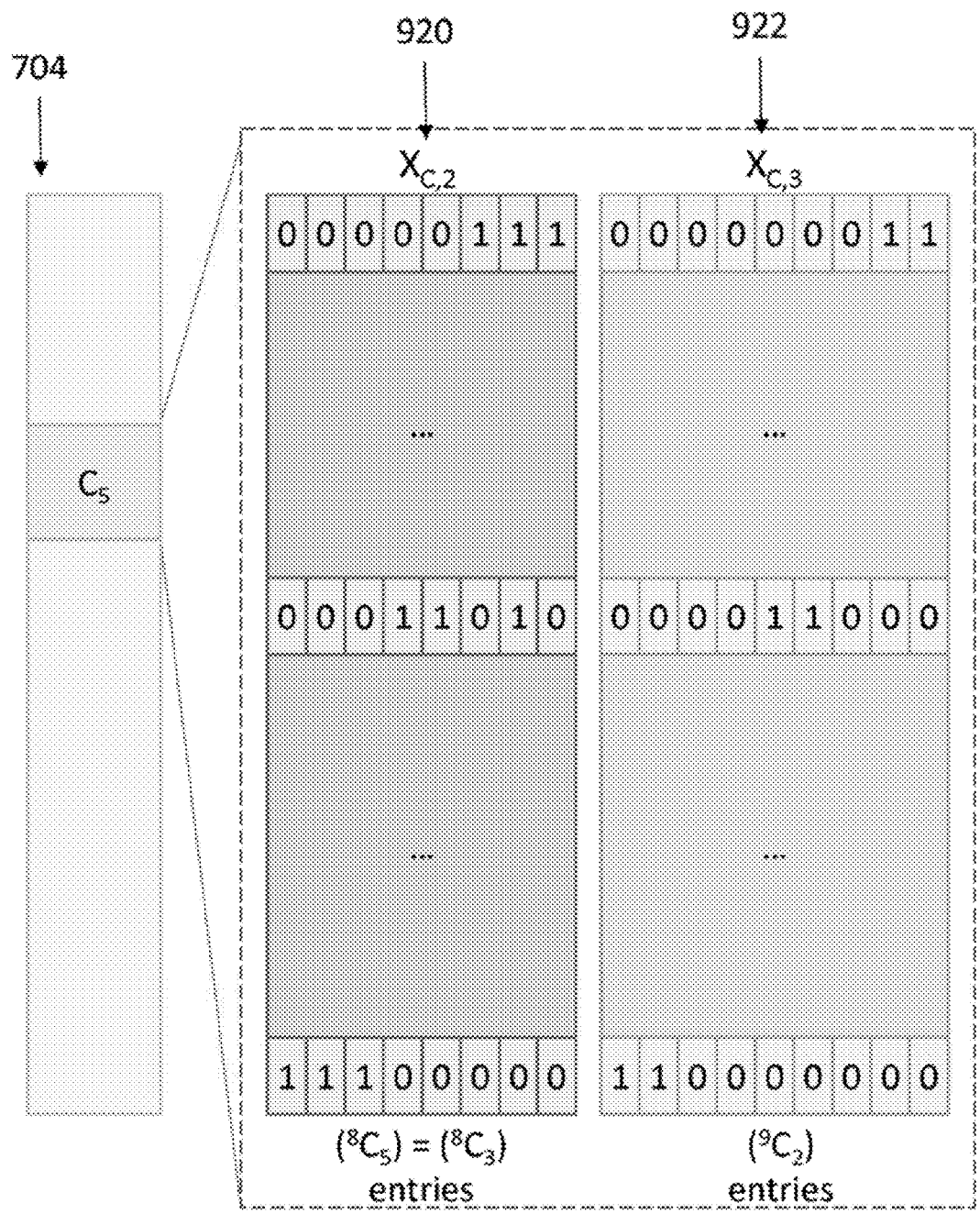

In FIG. 24, the section of codebook 704 is broken down into two codebooks 920 and 922. If $X_C$ maps to $C_5$, $X_{C,1}=X_C-T_{C,4}$. Then, store the entries in $C_5$ with codebooks 920 and 922. Codebook 920 contains $(^8C_5)$ entries. Since $(^8C_5)=(^8C_3)$, the codebook for $(^8C_5)$ can be inferred from the codebook for $(^8C_3)$ For the $(^8C_3)$ codebook, each entry is 8 bits in length and represents one way of selecting 3 cells out of 8 cells. Once an entry is selected from the $(^8C_3)$ codebook, flip all the bits to obtain the entry for the $(^8C_5)$ codebook. Codebook 922 contains $(^9C_2)$ entries. Each entry is 9 bits in length and represents one way of selecting 2 cells out of 9 cells. Next, compute $X_{C,2}=\text{floor}(X_{C,1}/(^9C_2))$, $X_{C,3}=X_{C,1}-X_{C,2}(^9C_2)$. There is no need to further break down the codebooks 920 and 922. $X_{C,2}$ is the index for selecting from the codebook 920. $X_{C,3}$ is the index for selecting from the codebook 922.

Figure 25:
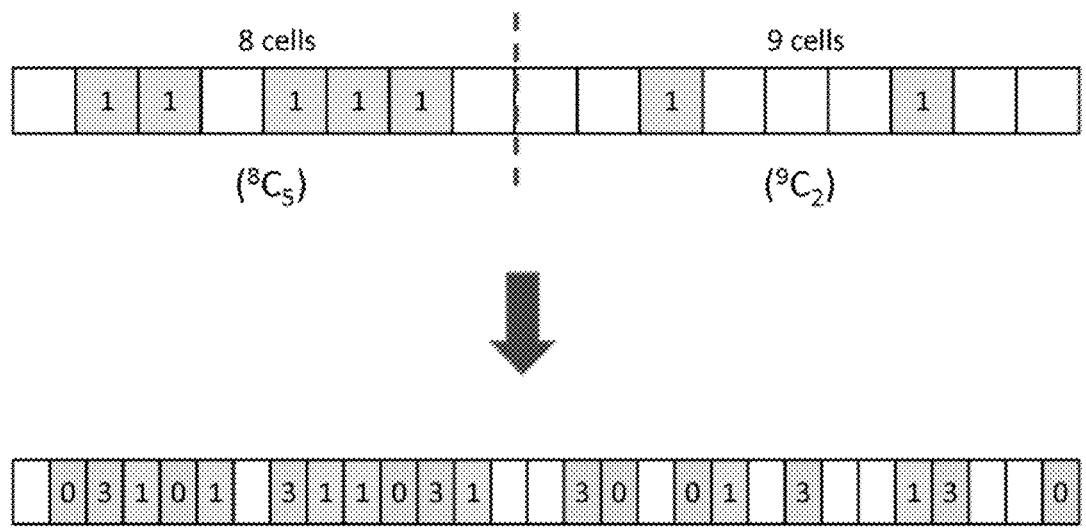
Figure 26:
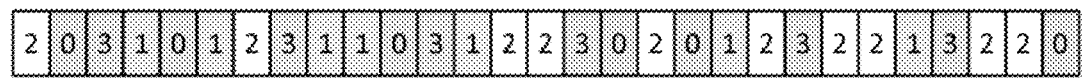
Figure 27:
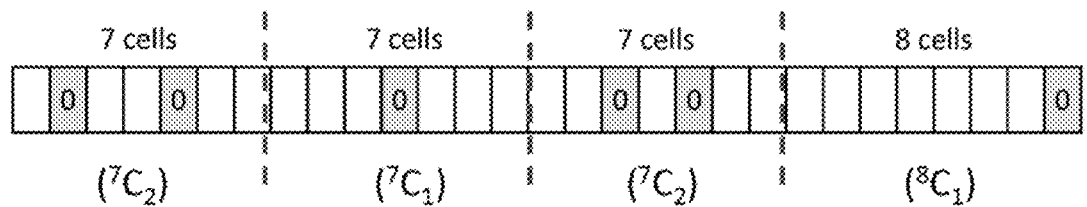
FIGS. 27 28, 29, 30, and 31 are diagrams showing a process for decoding according to aspects of the invention.

As shown in FIG. 25, the selected cells ay be mapped back to the original cells. The remaining cells are for level 2 as shown in FIG. 26.

In the above described example, the list of, codebooks needed are as followed:

$(^7C_0), (^7C_1), (^7C_2), (^7C_3)$ (64 entries)

$(^8C_0), (^8C_1), (^8C_2), (^8C_3), (^8C_4)$ (163 entries)

$(^9C_0), (^9C_1), (^9C_2), (^9C_3), (^9C_4)$ (256 entries)

$(^{14}C_0), (^{14}C_1), (^{14}C_2)$ (106 entries)

$(^{15}C_0), (^{15}C_1), (^{15}C_2)$ (121 entries)

Each entry in codebook $(^nC_k)$ is n bits in length and represents one way of selecting k cells out of n cells (e.g., store a 1 at each selected cell position and a 0 at the remaining cell positions). Codebooks $(^7C_4), \ldots, (^7C_7)$, $(^8C_5), \ldots, (^8C_8), (^9C_5), \ldots, (^9C_9)$ are also needed but can be inferred from the codebooks above (e.g., Exploit $(^nC_k)=(^nC_{n-k})$: If codebook $(^nC_k)$ is needed, read the entry directly; If codebook $(^nC_{n-k})$ is needed, read the entry and then flip all the bits). Thus, the total number of codebooks is 20, the total number of entries is 710, the total storage size is 920, and the maximum codebook is $(^9C_4)=126$ entries (7-bit LUT).

In addition, all permutations need to be stored on the device to facilitate the above disclosed systems and methods.

4-permutation case: (a,a,a,b), (a,a,b,a), (a,b,a,a), (b,a,a,a)

12-permutation case: (a,a,b,c), (a,b,a,c), (a,b,c,a), (b,a,c,a), ...

24-permutation case: (a,b,c,d (a,b,d,c), (a,d,b,c), (a,d,c,b), ...

Also, the denominators for the division operations needs to be stored (e.g., number of distinct values is 49 and the total storage size is less than 100 bytes).

With reference to FIGS. 27-31, an example of an 57/58 NSB decoder design is disclosed.

First, the decoder is configured to count the number of cells for each level. (e.g., $S_7=(6,6,7,10)$; Permutation=(0,3,1,2); Compute $X_0=T_6$. Then, it is determined(within $S_7$, which entry corresponds to (0,3,1,2) (e.g., Assume (0,3,1,2) maps to $S_{7,6}$, so $X_{1\_}=6$. Compute: $X_0=X_0+X_{1-1} T_{7,0}$).

Based on the cell positions for level 0, the appropriate codebooks are loaded by finding the indices of the corresponding codebook entries $X_{A,2,2}, X_{A,2,3}, X_{A,3,2}$, and $X_{A,3,3}$ and computing the following (FIG. 27):

$X_{A,2,1}=X_{A,1,3}+X_{A,2,2}(^7C_1)$ $X_{A,3,1}=X_{A,3,3}+X_{A,3,2}(^8C_1)$ $X_{A,2}=X_{A,2,1}+T_{A,3-0,1}$
(since $(^7C_2)$ and $(^7C_1)$ in order belong to $A_{3-0,2}$)

$X_{A,3}=X_{A,3,1}+T_{A,3-1,1}$
(since $(^7C_2)$ and $(^8C_1)$ in order belong to $A_{3-1,2}$).

Figure 28:
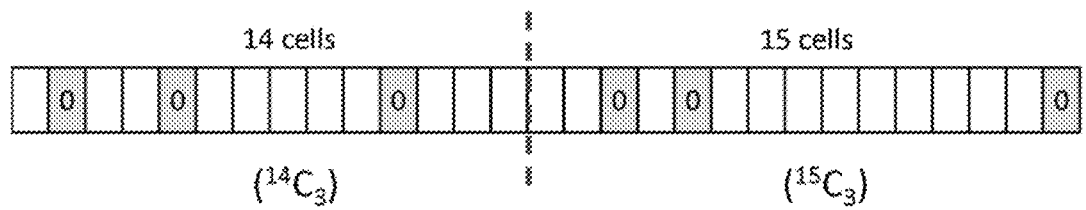
Figure 29:
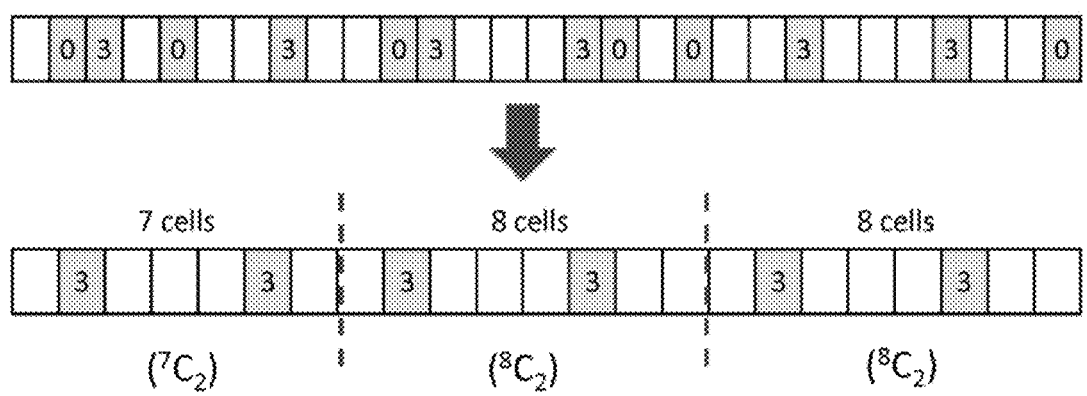

$X_{A,1}=X_{A,3}+X_{A,2}(^{15}C_3)$ $X_A=X_{A,1}+T_{A,2}$
(since $(^{14}C_3)$ and $(^{15}C_3)$ in order belong to $A_3$) (FIG. 28).

The appropriate codebooks are loaded based on the cell positions for level 3 by finding the indices of the corresponding codebook entries $(X_{B,2,2}, X_{B,2,3}$ and $X_{B,3})$ and computing the following (FIG. 29):

$X_{B,2,1}=X_{B,2,3}+X_{B,2,2}(^8C_2)$ $X_{B,2}=X_{B,2,1}+T_{B,4-0,1}$ (since $^7C_2)$ and $(^8C_2)$ in order belong to $B_{4-0,2}$)

Figure 30:
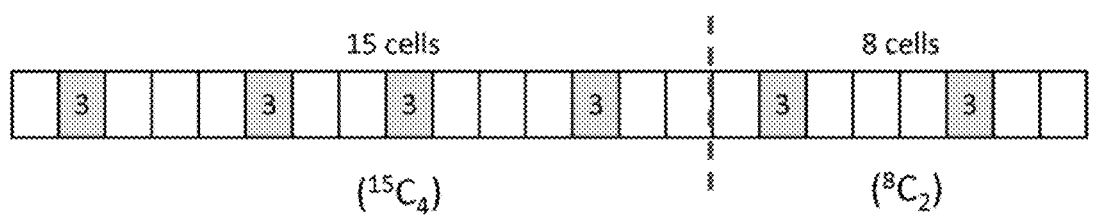
Figure 31:
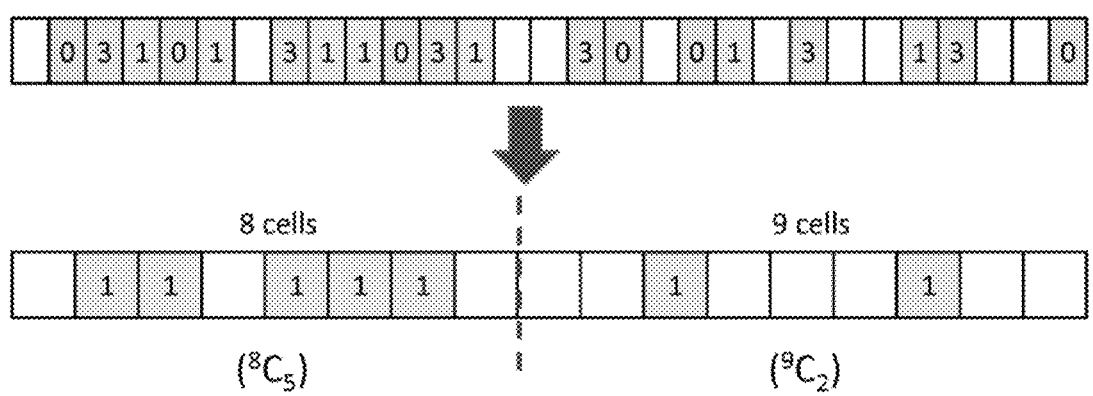

$X_{B,1}=X_{B,3}+X_{B,2}(^8C_2)$ $X_B=X_{B,1}+T_{B,3}$ (since $^{15}C_4)$ and $(^8C_2)$ in order belong to $B_4$) (FIG. 30).

The appropriate codebooks are loaded based on the cell positions for level 1 by finding the indices of the corresponding codebook entries $(X_{C,2}$ and $X_{C,3})$ and computing the following (FIG. 31):

$X_{C,1}=X_{C,3}+X_{C,2}(^9C_2)$ $X_C=X_{C,1}+T_{C,4}$ (since $(^8C_5)$ and $(^9C_2)$ in order belong to $C_5$)

Lastly, the following is computed:

$X_{A-R}=X_C+X_B(^{17}C_7)$ $X_2=X_{A-R}+X_A(^{23}C_6)(^{17}C_7)$ $X_0=X_0+X_2$  ($X_0$ was last updated at the beginning of the decoding)

$X_0$ is the final result.

While the present invention has been particularly shown and described with reference to exemplary embodiments thereof, it will be understood by those of ordinary skill, in the art that various changes in form and details may be made therein without departing from the spirit and scope of the present invention as defined by the following claims. Thus, the foregoing is by way of example only and is not intended to be limiting. For example, any numbers of elements illustrated and described herein are by way of example only. The present invention is limited only as defined in the following claims and equivalents thereof.

What is claimed is:

1. A method of encoding a near-symbol balanced (NSB) sequence, comprising:
   selecting with a controller a constraint based on an amount of bits;
   determining, with the controller, a plurality of sections in a codebook based on permutations defined by the selected constraint; and
   partitioning, with the controller, a section among the plurality of sections into a plurality of partitions until each of the plurality of partitions include a number of entries equal to or less than a predetermined number of entries.

2. The method of claim 1, wherein the partitioning step is performed until each of the partitions include 256 entries or less.

3. The method of claim 1, further comprising setting a plurality of thresholds that define to which section among the plurality of sections a number maps.

4. The method of claim 1, wherein the section among the plurality of sections is partitioned based on a Chu-Vandermonde identity.

5. The method of claim 1, wherein the controller is implemented on a PCRAM device.

6. The method of claim 1, wherein the constraint includes a lower constraint based on a minimum number of times an alphabet appears in a sequence.

7. The method of claim 1, wherein the constraint includes an upper constraint based on a maximum number of times an alphabet appears in a sequence.

8. A system for encoding a near-symbol balanced (NSB) sequence, including:
a controller suitable for:
selecting a constraint based on an amount of bits;
determining a plurality of sections in a codebook based on permutations defined by the selected constraint; and
partitioning a section among the plurality of sections into a plurality of partitions until each of the plurality of partitions includes a number of entries equal to or less than a predetermined number of entries.

9. The system of claim 8, wherein the predetermined number of entries is 256 entries.

10. The system of claim 8, wherein the controller is further suitable for setting a plurality of thresholds that define to which section among the plurality of sections a number maps.

11. The system of claim 8, wherein the section among the plurality of sections is partitioned based on a Chu-Vandermonde identity.

12. The system of claim 8, wherein the controller is implemented on a PCRAM device.

13. The system of claim 8, wherein the constraint includes a lower constraint based on a minimum number of times an alphabet appears in a sequence.

14. The system of claim 8, wherein the constraint includes an upper constraint based on a maximum number of times an alphabet appears in a sequence.

* * * * *